United States Patent
Ibukuro et al.

(10) Patent No.: US 6,807,245 B2
(45) Date of Patent: Oct. 19, 2004

(54) PLO DEVICE

(75) Inventors: Sadao Ibukuro, Kawasaki (JP); Setsuo Misaizu, Hokkaido (JP); Isao Nakajima, Shizuoka (JP)

(73) Assignee: Fujitsu Limited, Kawasaki (JP)

(*) Notice: Subject to any disclaimer, the term of this patent is extended or adjusted under 35 U.S.C. 154(b) by 116 days.

(21) Appl. No.: 10/211,232

(22) Filed: Aug. 5, 2002

(65) Prior Publication Data

US 2003/0215043 A1 Nov. 20, 2003

Related U.S. Application Data

(63) Continuation of application No. PCT/JP02/04830, filed on May 17, 2002.

(51) Int. Cl.[7] .................................................. H03D 3/24
(52) U.S. Cl. ..................... 375/376; 375/373; 375/327; 375/294; 375/215; 398/202; 398/155
(58) Field of Search ............................ 375/376, 373, 375/371, 360, 374, 348, 285, 342, 329, 260, 327, 294, 215, 372, 355, 361; 331/2, 1 A, 11; 398/201, 212, 202, 155, 122, 154

(56) References Cited

U.S. PATENT DOCUMENTS

| | | | | |
|---|---|---|---|---|
| 4,926,447 A | * | 5/1990 | Corsetto et al. | 375/376 |
| 5,027,085 A | * | 6/1991 | DeVito | 331/1 A |
| 5,115,208 A | * | 5/1992 | Masdea et al. | 331/1 A |
| 5,332,978 A | * | 7/1994 | Yabuki et al. | 331/2 |

FOREIGN PATENT DOCUMENTS

| JP | 52-3770 | 1/1977 |
|---|---|---|
| JP | 63-084222 | 4/1988 |

OTHER PUBLICATIONS

Hogge (Lightwave Technology, Journal of, vol.: 3, Issue: 6, Dec. 1985 pp.: 1312–1314).*
Tang et al. (Circuits and Systems, 2000. Proceedings of the 43rd IEEE Midwest Symposium on, vol.: 1, Aug. 8–11, 2000 pp.: 428–431 vol. 1).*
Japanese Abstract, Publication No. 63184966 A, Jul. 30, 1988.
International Preliminary Examination Report dated Jul. 22, 2003 for corresponding PCT/JP02/04830.
International Search Report dated Aug. 20, 2002 in corresponding Application No. PCT/JP02/04830.

* cited by examiner

Primary Examiner—Stephen Chin
Assistant Examiner—Ted Wang
(74) Attorney, Agent, or Firm—Staas & Halsey LLP

(57) ABSTRACT

There is provided a PLO device which performs high-accuracy, high-quality clock recovery. A shifted data generation part generates shifted data, and a first phase comparison part outputs first difference data. A first filter removes an alternating-current component from the first difference data and outputs a first detection voltage. A delay part delays input data for a time corresponding to half of one time slot with the use of an analog delay element and outputs delayed data. A second phase comparison part compares the phases of the input data and delayed data with each other and outputs second difference data. A second filter removes an alternating-current component from the second difference data and outputs a second detection voltage. An arithmetic section divides the first detection voltage by the second detection voltage to obtain a control voltage. A clock oscillation section outputs recovered clock based on the control voltage.

6 Claims, 44 Drawing Sheets

PLO DEVICE

This application is a continuing application, filed under 35 U.S.C. §111(a), and 120, of International Application PCT/JP02/04830, filed May 17, 2002.

BACKGROUND OF THE INVENTION

1. Field of the Invention

The present invention relates to a PLO (Phase Locked Oscillator) device, and more particularly, to a PLO device for carrying out clock recovery based on an input signal.

2. Description of the Related Art

A PLO is a circuit wherein feedback control is performed for oscillation so that the phase difference between an input signal supplied from outside and the output of an oscillator within the loop becomes constant, to obtain an oscillating output in phase with the input signal. PLOs are used in various fields such as optical communication field, mobile communication field and digital audio field, and the importance thereof is growing in recent years.

FIG. 41 shows the configuration of a conventional PLO circuit. The PLO circuit 8 comprises a discriminator (comparator) 81, a D-type flip-flop (FF) 82, an exclusive OR gate (EOR) 83, a loop filter 84, and a VCO (Voltage Controlled Oscillator) section 85.

The connections of the elements will be described first. The output of the discriminator 81 is connected to the D terminal of the FF 82 and one input terminal of the EOR 83. The Q terminal of the FF 82 is connected to the other terminal of the EOR 83, the output of which is input to the loop filter 84. The output of the loop filter 84 is input to the VCO section 85, whose output is connected to the clock input terminal of the FF 82.

The discriminator 81 discriminates between "0" and "1" of input signal D0. The FF 82 shifts input data D1 for a time corresponding to half of one time slot, and outputs shifted data D2. The EOR 83 detects the phase difference between the two, phase-shifted and unshifted signals, and outputs difference data D3. The loop filter 84 removes an alternating-current component from the difference data D3 and outputs a direct-current control voltage D4. The VCO section 85 oscillates at an output frequency (input clock for the FF 82) proportional to the control voltage D4.

FIG. 42 is a time chart illustrating operation of the PLO circuit 8. The figure shows the waveforms of the input data D1, shifted data D2, difference data D3 and control voltage D4, which are based on an exemplary sequence pattern of "0s" and "1s".

The pulse width of the difference data D3 varies in accordance with a phase difference φ between the input data D1 and the shifted data D2. Specifically, the pulse width decreases with decrease in the phase difference φ and increases with increase in the phase difference φ.

The control voltage D4 is a direct-current voltage (solid line) (rectangular wave indicated by the dashed line shows the difference data D3). If the phase difference φ decreases and the waveform of the shifted data D2 shifts forward relative to the input data D1, then the pulse width of the difference data D3 narrows, so that the control voltage D4 approaches zero.

If the phase difference φ increases and the waveform of the shifted data D2 shifts backward relative to the input data D1, the pulse width of the difference data D3 widens, and thus the control voltage D4 increases away from zero.

In the PLO circuit 8, the control voltage D4, which is based on the oscillating output, is fed back to the VCO section 85. Thus, control is performed in a manner such that if the oscillating output is delayed, the oscillation frequency is increased to advance the phase, and that if the oscillating output is advanced, the oscillation frequency is decreased to delay the phase, whereby an oscillation frequency in phase with the input signal can be output.

However, the conventional PLO circuit 8 described above is very often adjusted such that clock recovery is carried out based on the input signal D0 having an average pattern (e.g. PN (Pseudo-Noise) pattern etc.) of transition rate, and thus a problem arises in that clock phase change or out-of-phase error occurs when the circuit is input with a signal having a pattern of larger or smaller transition rate.

The transition denotes a level change of the input signal D0 from "0" to "1" or from "1" to "0", and the transition rate represents the number of level changes per unit time.

FIG. 43 illustrates the relationship between the control voltage D4 and the phase difference φ. The vertical axis indicates the control voltage D4, and the horizontal axis indicates the phase difference φ. The control voltage D4 (solid line) is derived based on the input signal D0, while a control voltage D4-1 (dotted line) is derived based on an input signal (hereinafter referred to as repeating-pattern signal) having a repeating pattern (pattern with large transition rate) in which "0" and "1" are alternately repeated.

In either case, the control voltage becomes zero when the phase difference φ is 0 or nπ (n=±2, ±4, . . . ), and rises linearly within one period (pattern is repeated such that the control voltage rises as the phase difference φ increases within a period and drops to zero at the end of the period).

The repeating-pattern signal has a high frequency of level changes from "0" to "1" or from "1" to "0", and thus has a larger transition rate than the input signal D0. Accordingly, when the repeating-pattern signal is input to the PLO circuit 8 of FIG. 41, the difference data generated within the circuit through the phase comparison contains an increased high-frequency component, so that the loop filter 84 outputs the control voltage D4-1 which has a larger value than the control voltage D4 derived based on the input signal D0.

FIG. 44 illustrates how clock phase change and out-of-phase error occur. It is assumed that for the control voltage D4 derived based on the input signal D0, a reference voltage Vref, or a threshold, of the VCO section 85 is set approximately at the middle of the inclined straight line of the control voltage D4, and that the reference point is at a position P1 (where normal locking is achievable).

Also, in the figure, H represents a pull-in range (phase controllable range) of the PLO circuit 8. If the varying point of the control voltage D4 is within the pull-in range H, the PLO circuit 8 is capable of normal locking.

On the other hand, if the repeating-pattern signal is input to the PLO circuit 8 and the control voltage D4 changes to a control voltage D4-1a, the reference point shifts from the position P1 to a position P2. In this case, since the reference point is still within the pull-in range H, the phase can be locked but at a position deviated forward, with the result that a clock phase change occurs.

In the case of a control voltage D4-1b with an even greater voltage value, the reference point shifts to a position P3. In this case, since the reference point is outside the pull-in range H, the phase fails to be locked and an out-of-phase error occurs.

In this manner, in cases where a repeating pattern having a large transition rate is input to the PLO circuit 8 which is designed to be supplied with an average transition rate pattern, the PLO circuit 8 malfunctions. Namely, the control voltage is dependent on the transition rate, and therefore, if the transition rate changes, the conventional circuit fails to perform stable operation.

In the foregoing, malfunction attributable to change in the transition rate is explained on the premise that the control voltage is dependent on the transition rate. In practice, however, the control voltage is dependent not only on the transition rate but on S/N (Signal Noise Ratio). Accordingly, if a PLO circuit designed to operate under high S/N conditions is used in poor S/N conditions, the circuit fails to operate normally and a similar malfunction such as clock phase change or out-of-phase error occurs.

SUMMARY OF THE INVENTION

The present invention was created in view of the above circumstances, and an object thereof is to provide a PLO device in which parameters related to transition rate and S/N are removed from control voltage to perform high-accuracy, high-quality clock recovery.

To achieve the object, the present invention provides a PLO device for performing clock recovery. The PLO device is characterized by comprising a first voltage detection section which includes a shifted data generation part for shifting input data with use of recovered clock to generate shifted data, a first phase comparison part for comparing phases of the input data and the shifted data with each other and outputting first difference data, and a first filter for removing an alternating-current component from the first difference data and outputting a first detection voltage, a second voltage detection section which includes a delay part for delaying the input data for a time corresponding to half of one time slot with use of an analog delay element and outputting delayed data, a second phase comparison part for comparing phases of the input data and the delayed data with each other and outputting second difference data, and a second filter for removing an alternating-current component from the second difference data and outputting a second detection voltage, an arithmetic section for dividing the first detection voltage by the second detection voltage to obtain a control voltage, and a clock oscillation section for outputting the recovered clock with an oscillation frequency thereof varied in accordance with the control voltage.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
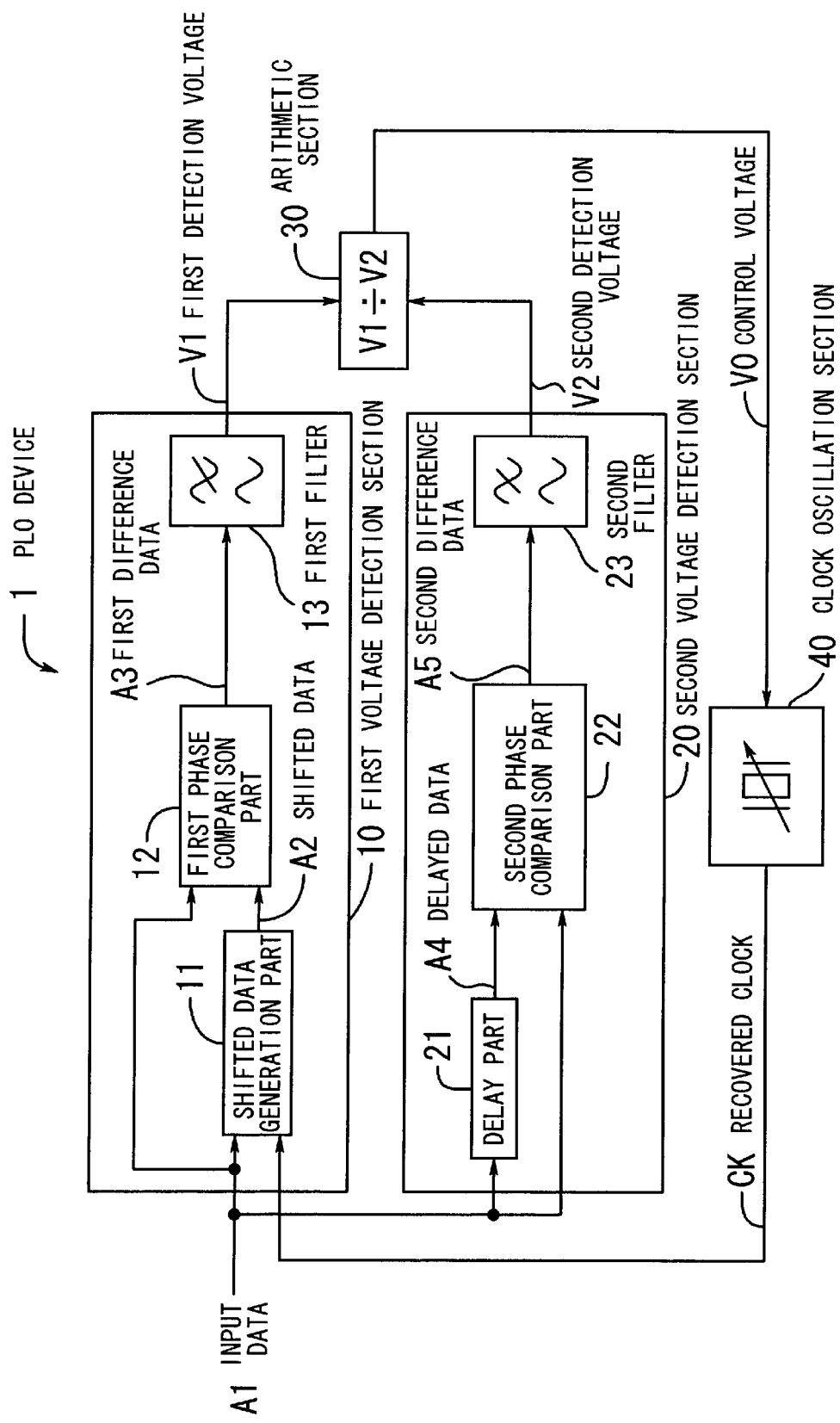
FIG. 1 is a diagram illustrating the principle of a PLO device according to the present invention.

Embodiments of the present invention will be hereinafter described with reference to the drawings. FIG. 1 illustrates the principle of a PLO device according to the present invention. The PLO device 1 comprises a first voltage detection section 10, a second voltage detection section 20, an arithmetic section 30 and a clock oscillation section 40.

The first voltage detection section 10 is constituted by a shifted data generation part 11, a first phase comparison part 12, and a first filter 13. The shifted data generation part 11 shifts the phase of input data A1 (in a standard state, for a time corresponding to half of one time slot) with the use of recovered clock CK to generate shifted data A2.

The first phase comparison part 12 compares the phases of the input data A1 and shifted data A2 with each other and outputs first difference data (hereinafter difference data A3). The first filter 13, which is a low-pass filter, removes an alternating-current component from the difference data A3 and outputs a first detection voltage (hereinafter detection voltage V1).

The second voltage detection section 20 is constituted by a delay part 21, a second phase comparison part 22, and a second filter 23. The delay part 21 delays the input data A1 for a time corresponding to half of one time slot by means of an analog delay element and outputs delayed data A4. The second phase comparison part 22 compares the phases of the input data A1 and delayed data A4 with each other and outputs second difference data (hereinafter difference data A5). The second filter 23 removes an alternating-current component from the difference data A5 and outputs a second detection voltage (hereinafter detection voltage V2).

The arithmetic section 30 divides the detection voltage V1 by the detection voltage V2 to obtain a control voltage V0. The clock oscillation section 40 has a VCO function and outputs the recovered clock CK with an oscillation frequency thereof varied in accordance with the control voltage V0. The configuration and operation of the PLO device 1 will be described in detail later.

The following is a detailed, step-by-step description of the procedure adopted in designing the PLO device 1 of the present invention, along with the problem to be solved by the present invention. As explained above with reference to FIGS. 41 to 44, in the conventional PLO circuit 8, the control voltage applied to the VCO is dependent on the transition rate of the input signal; therefore, as the transition rate changes, the control voltage also varies, causing malfunction. First, how to remove the parameter related to transition rate from the control voltage will be described.

Figure 2:
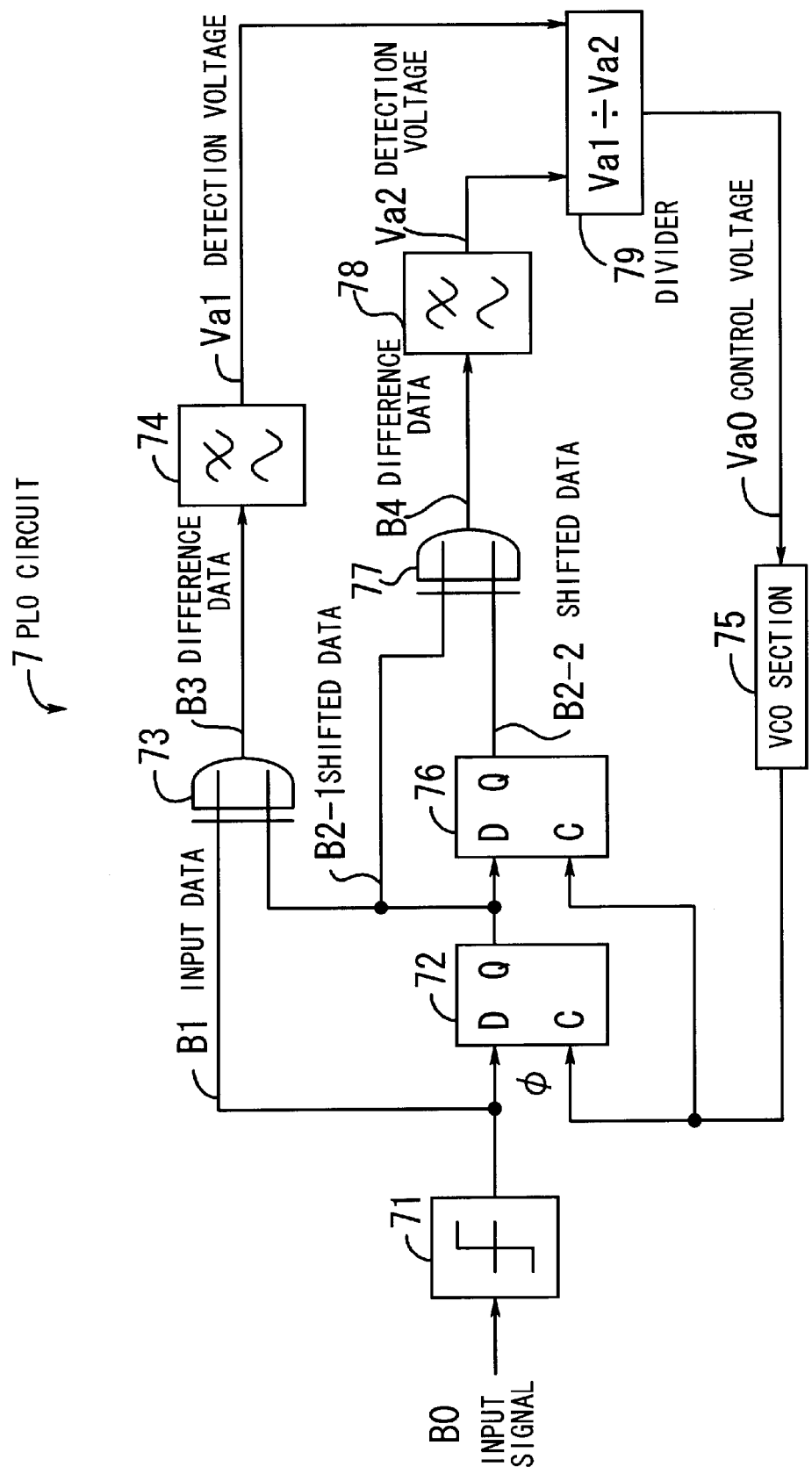
FIG. 2 is a diagram showing a schematic configuration of a PLO circuit.

FIG. 2 shows a schematic configuration of a PLO circuit 7 in which the transition rate-related parameter is removed from the control voltage. First, the connections of individual elements will be described.

The output of a discriminator 71 is connected to the D terminal of an FF 72 and one input terminal of an EOR 73. The Q terminal of the FF 72 is connected to the D terminal of an FF 76, the other terminal of the EOR 73 and one terminal of an EOR 77. The Q terminal of the FF 76 is connected to the other terminal of the EOR 77.

The output of the EOR 73 is input to a low-pass filter 74, whose output is input to a divider 79. The output of the EOR 77 is input to a low-pass filter 78, the output of which is input to the divider 79. The output of the divider 79 is input to a VCO section 75, whose output is connected to the clock input terminals of the FFs 72 and 76.

The discriminator 71 discriminates between "0" and "1" of input signal B0. The FF 72 shifts input data B1 for a time corresponding to half of one time slot and outputs shifted data B2-1. The EOR 73 detects a phase difference between the two, phase-shifted and unshifted signals, and outputs difference data B3. The low-pass filter 74 removes an alternating-current component from the difference data B3 and outputs a direct-current detection voltage Va1.

The FF 76 shifts the shifted data B2-1 for a time corresponding to half of one time slot and outputs shifted data B2-2. The EOR 77 detects a transition between the two, phase-shifted and unshifted signals, and outputs difference data B4. The low-pass filter 78 removes an alternating-current component from the difference data B4 and outputs a direct-current detection voltage Va2.

The divider 79 divides the detection voltage Va1 by the detection voltage Va2 to obtain a control voltage Va0. The VCO section 75 oscillates at an output frequency (input clock for the FFs 72 and 76) proportional to the control voltage Va0.

Figure 3:
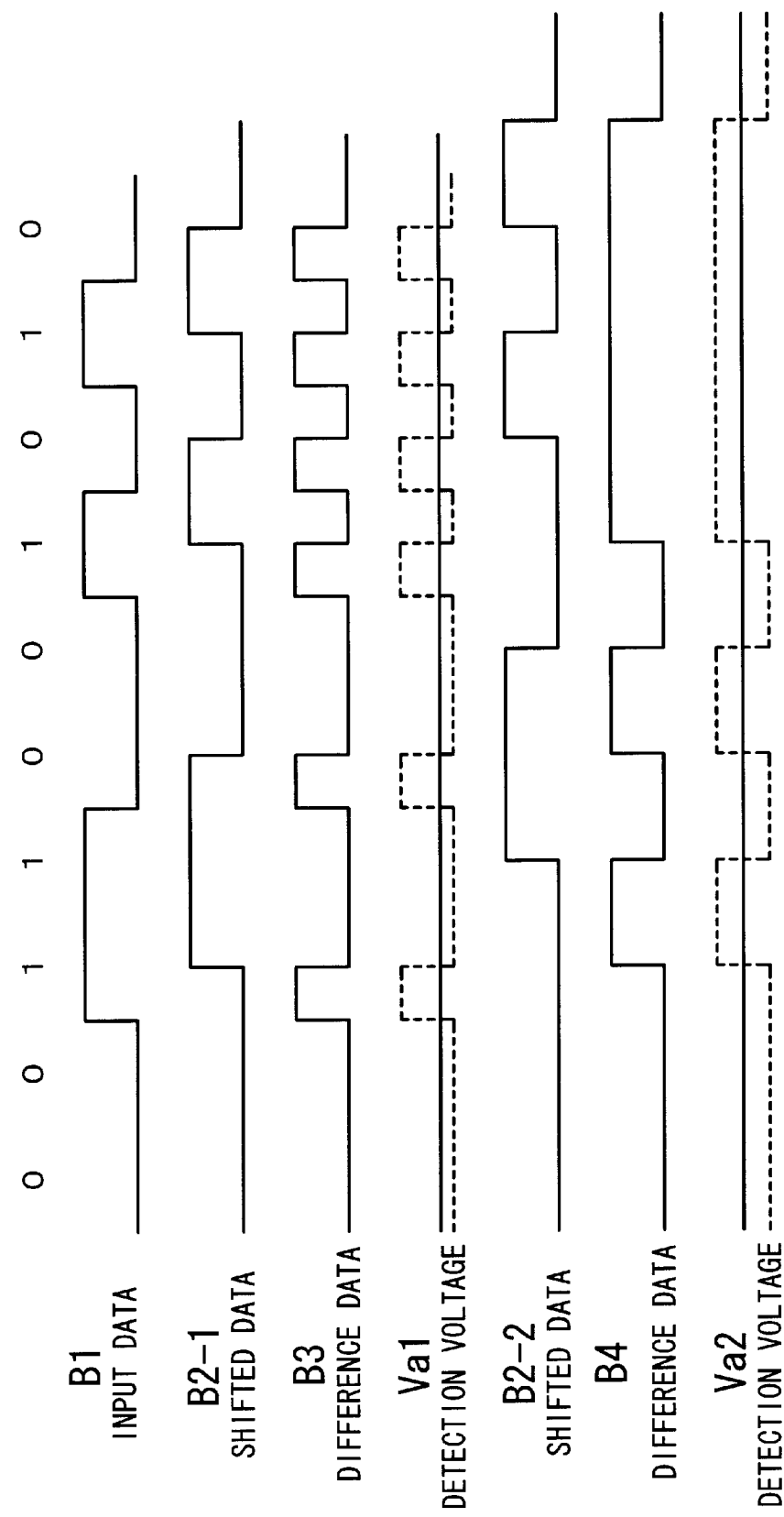
FIG. 3 is a time chart illustrating operation of the PLO circuit.

FIG. 3 is a time chart illustrating operation of the PLO circuit 7. The figure shows the waveforms of the input data B1, shifted data B2-1, difference data B3, detection voltage Va1, shifted data B2-2, difference data B4 and detection voltage Va2, which are based on an exemplary sequence pattern of "0s" and "1s".

Figure 42:
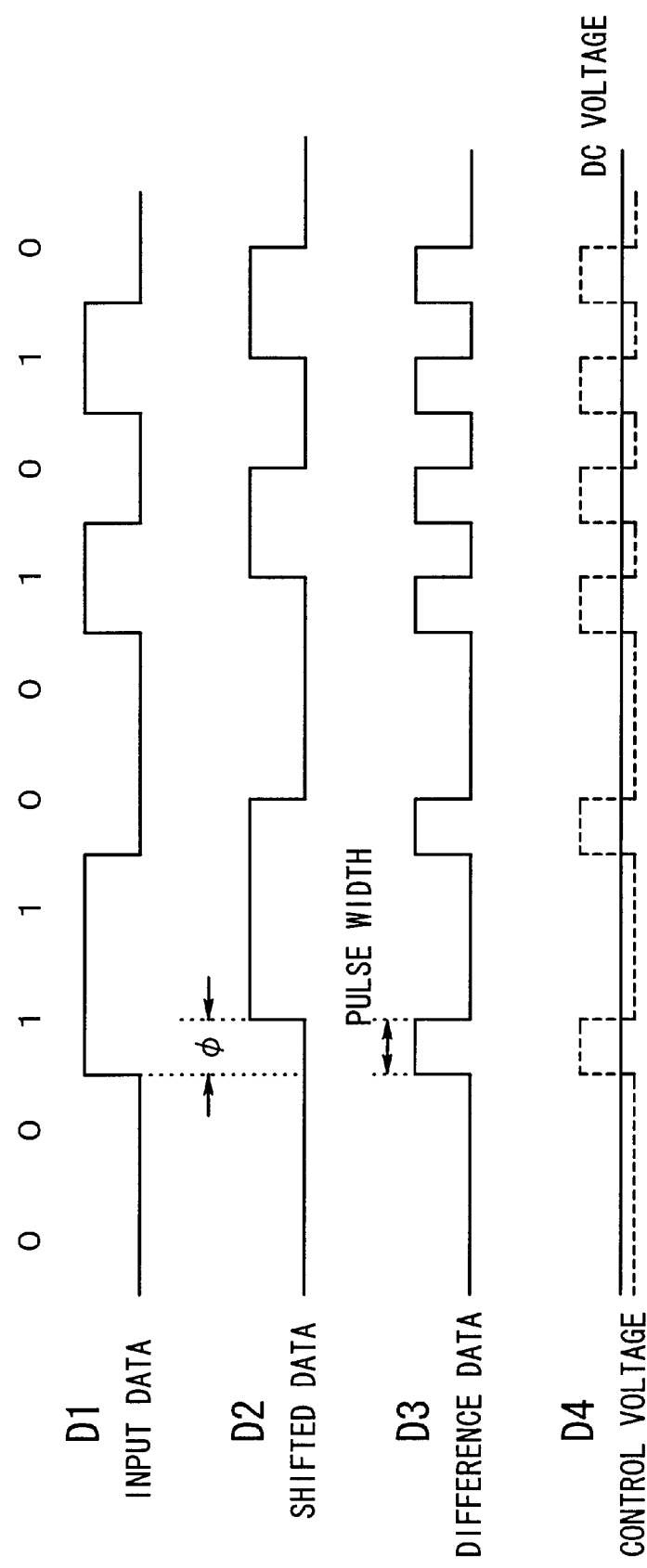
FIG. 42 is a time chart illustrating operation of the PLO circuit.
Figure 43:
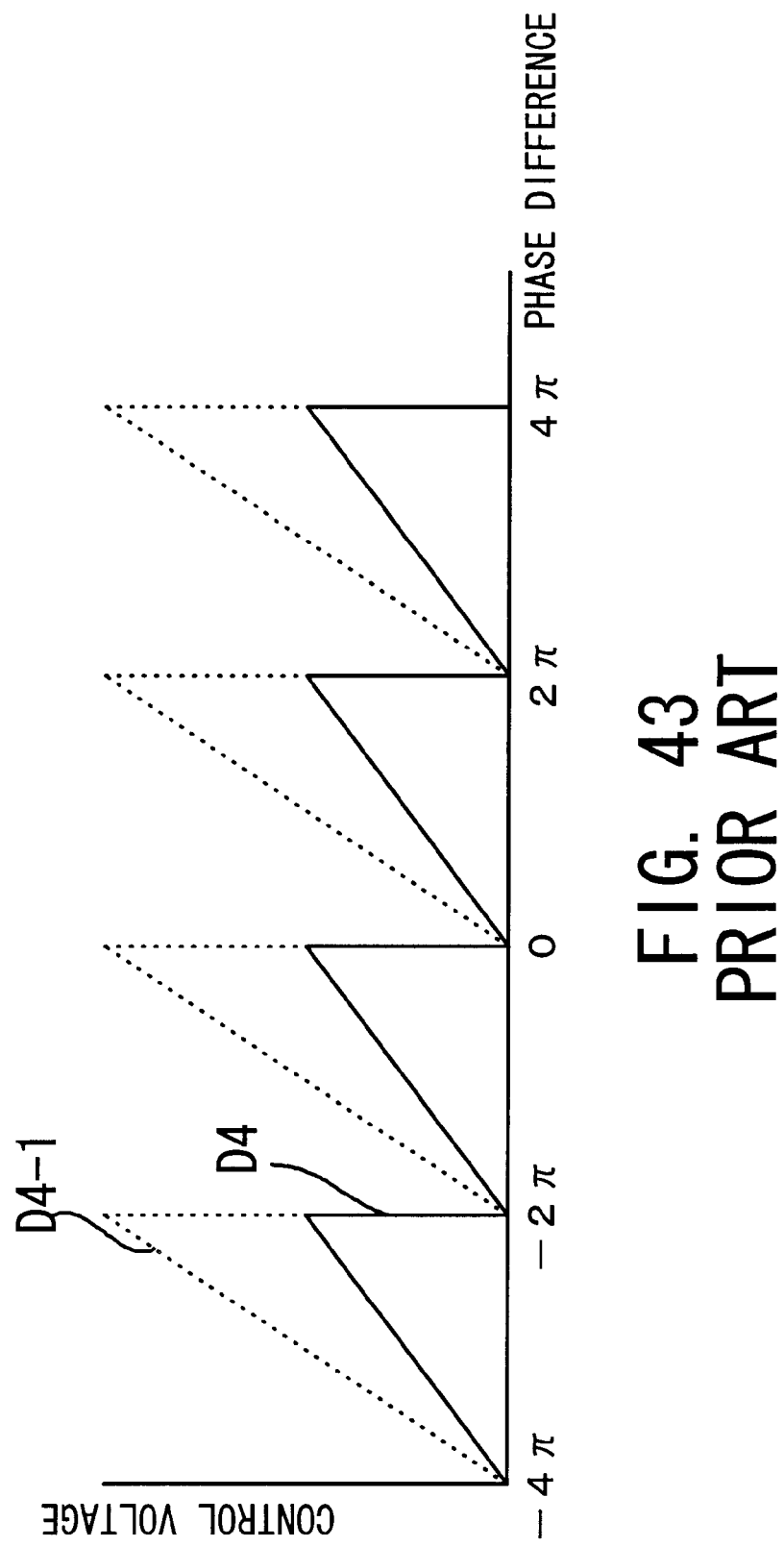
FIG. 43 is a diagram showing the relationship between control voltage and phase difference.
Figure 44:
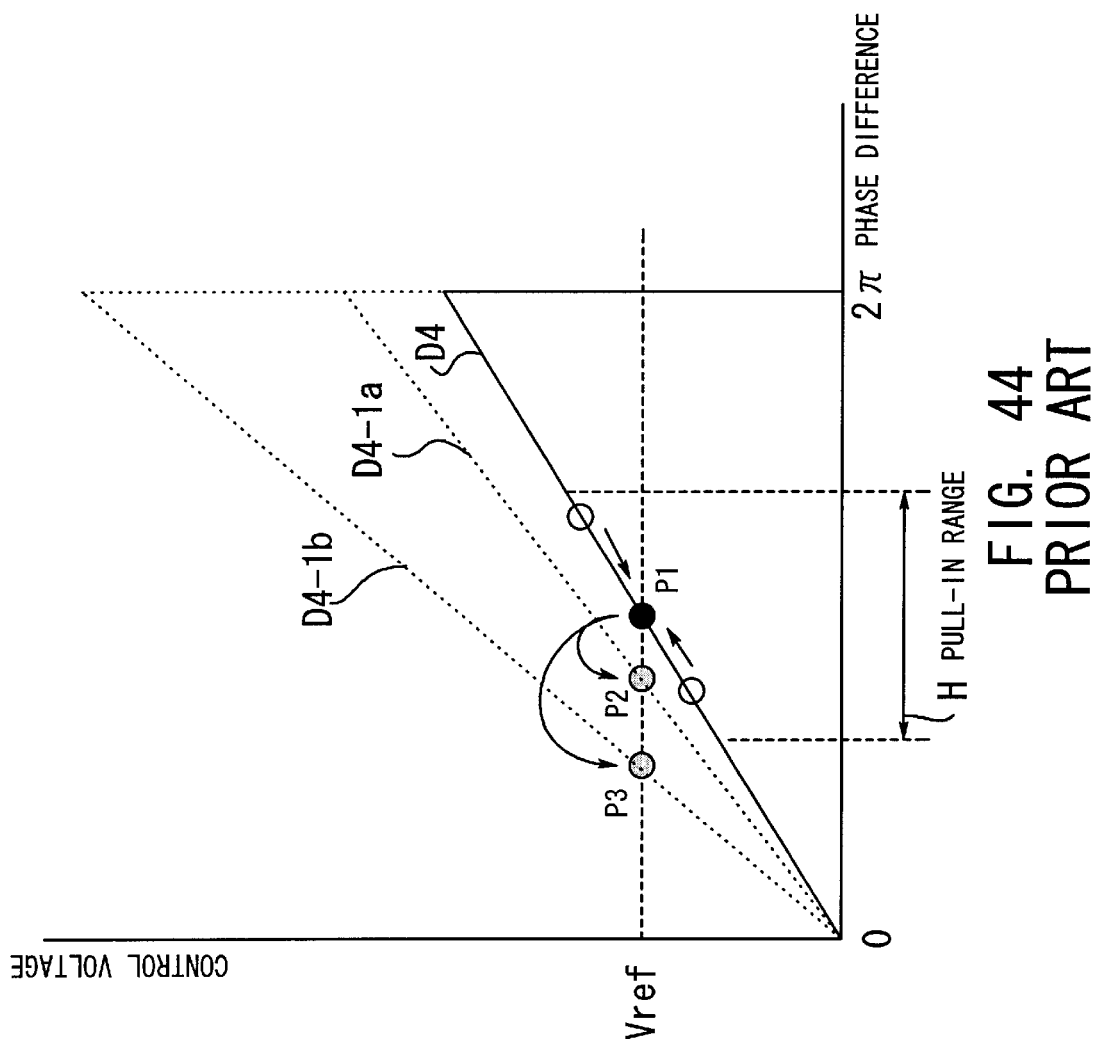
FIG. 44 is a diagram illustrating how clock phase change and out-of-phase error occur.

The first through fourth waveforms from the top of the time chart are identical with those shown in FIG. 42. The detection voltage Va1 contains the parameters related to both phase difference φ and transition rate (the detection voltage Va1 is a function of the phase difference φ and the transition rate).

On the other hand, the PLO circuit 7 is configured to generate a waveform containing parameter information on the transition rate of the input data B1 so that the transition rate-related parameter can be removed from the control voltage. Specifically, the shifted data B2-1 is again shifted based on the clock to generate the shifted data B2-2, and an exclusive-OR of the shifted data B2-1 and B2-2 is derived.

Consequently, as seen from FIG. 3, a waveform (difference data B4) is obtained which turns to "H" in proportion to the transition of the input data B1. The detection voltage Va2, which is generated by filtering the difference data B4, therefore contains the parameter related to transition rate (the detection voltage Va2 is a function of the transition rate).

Thus, by dividing the detection voltage Va1 by the detection voltage Va2, it is possible to eliminate the transition rate-related parameter. Specifically, the output signal from the divider 79 does not contain the transition rate-related parameter, and accordingly, by using the output signal as the control voltage for the VCO section 75, it is possible to establish a phase lock loop that is not affected by change of the transition rate.

Thus, the transition rate is eliminated from the control voltage; therefore, the PLO circuit 7 does not malfunction even if input with a repeating pattern having a large transition rate, unlike the conventional circuit. No problem therefore arises insofar as the PLO circuit 7 is used under high S/N conditions.

However, if the PLO circuit 7 is used under poor S/N conditions, malfunction such as out-of-phase error readily occurs, because the control voltage is dependent not only on the transition rate but on the parameter related to S/N. Accordingly, the PLO circuit 7 cannot be directly put to use in low S/N environments (in which S/N deteriorates).

The following describes why a PLO device capable of normal operation even under low S/N conditions is demanded. In recent years, VLSI is easily available and error correcting code (hereinafter FEC: Forward Error Correction) has come to be applied to optical transmissions at 10 Gb/s. Also, the ITU-T recommends systems using FEC (G. 709 Recommendations), and FEC, the application of which has been limited hitherto to submarine communications alone, has come to be used for overland communications as well.

There has also been developed an LSI having an error correction characteristic such that an error rate of $1 \times 10^{-2}$, for example, is corrected to $1 \times 10^{-15}$. In order for a receiving side to discriminate and recover information affixed with FEC having such a high correction capability, it is necessary that the receiving side be capable of normal clock recovery even under low S/N conditions at an error rate of $1 \times 10^{-2}$.

This is because a transmitting/receiving device using FEC permits increase of transmission distance, so that information is transmitted/received under low S/N conditions. It is therefore necessary that the receiving-side device should be capable of normal clock recovery even under such low S/N conditions.

Accordingly, a PLO circuit which is used, for example, in an O/E conversion section of an optical receiving device for the discrimination/recovery of data must be designed so that it can operate satisfactorily under low S/N conditions (e.g. at an error rate of $1 \times 10^{-2}$, $1 \times 10^{-3}$).

Figure 4:
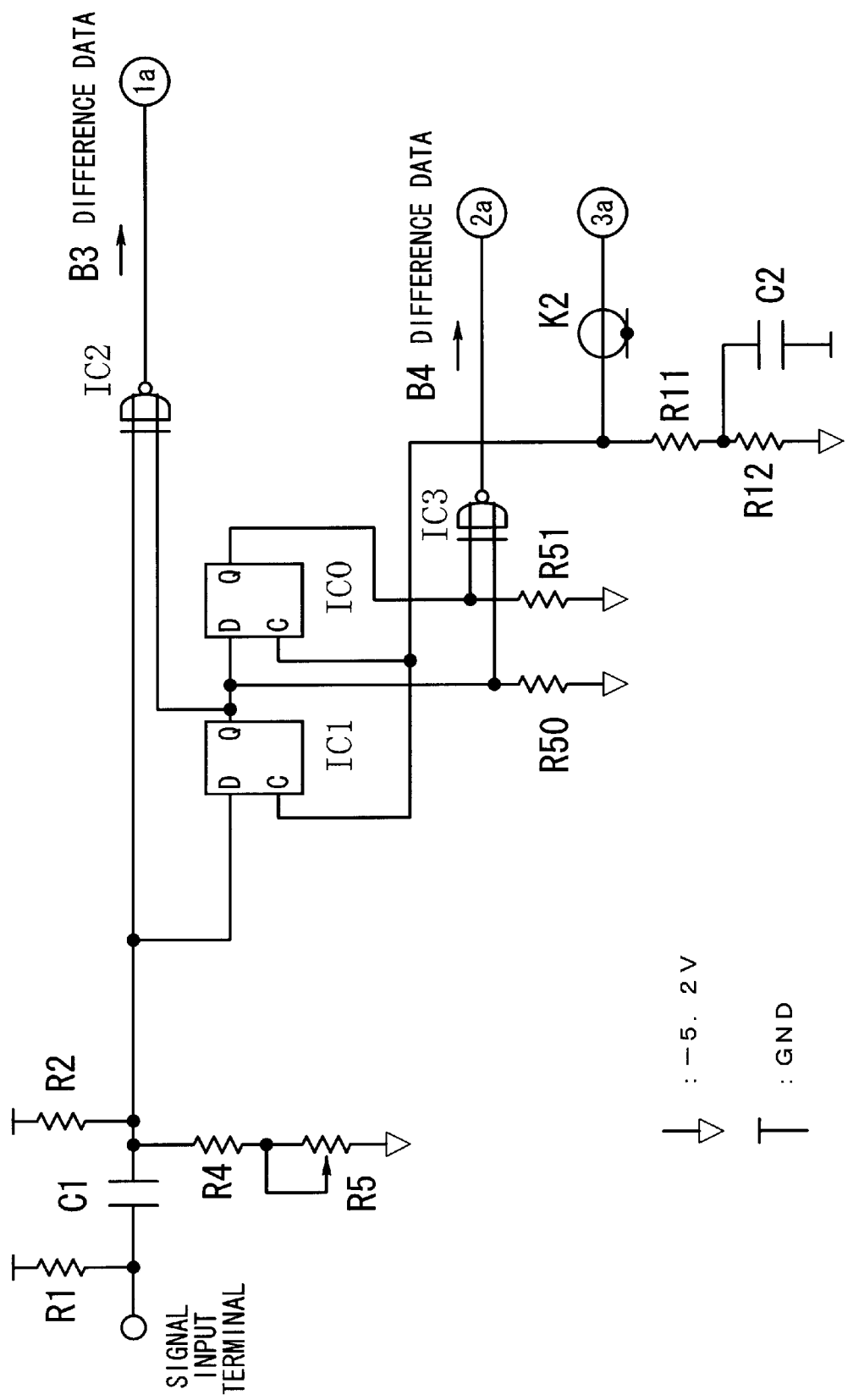
FIG. 4 is a diagram showing the configuration of the PLO circuit.
Figure 5:
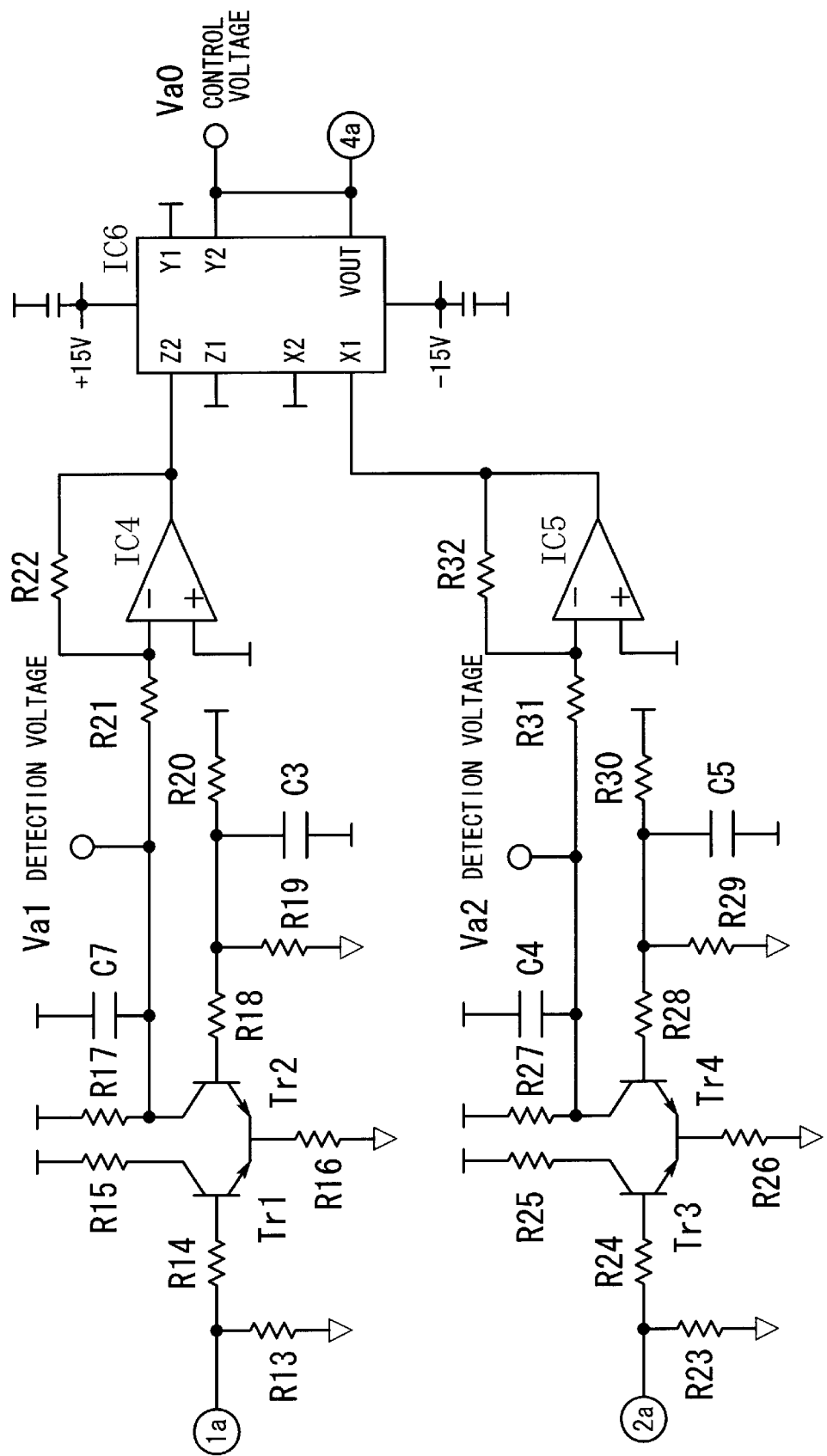
FIG. 5 is a diagram also showing the configuration of the PLO circuit.
Figure 6:
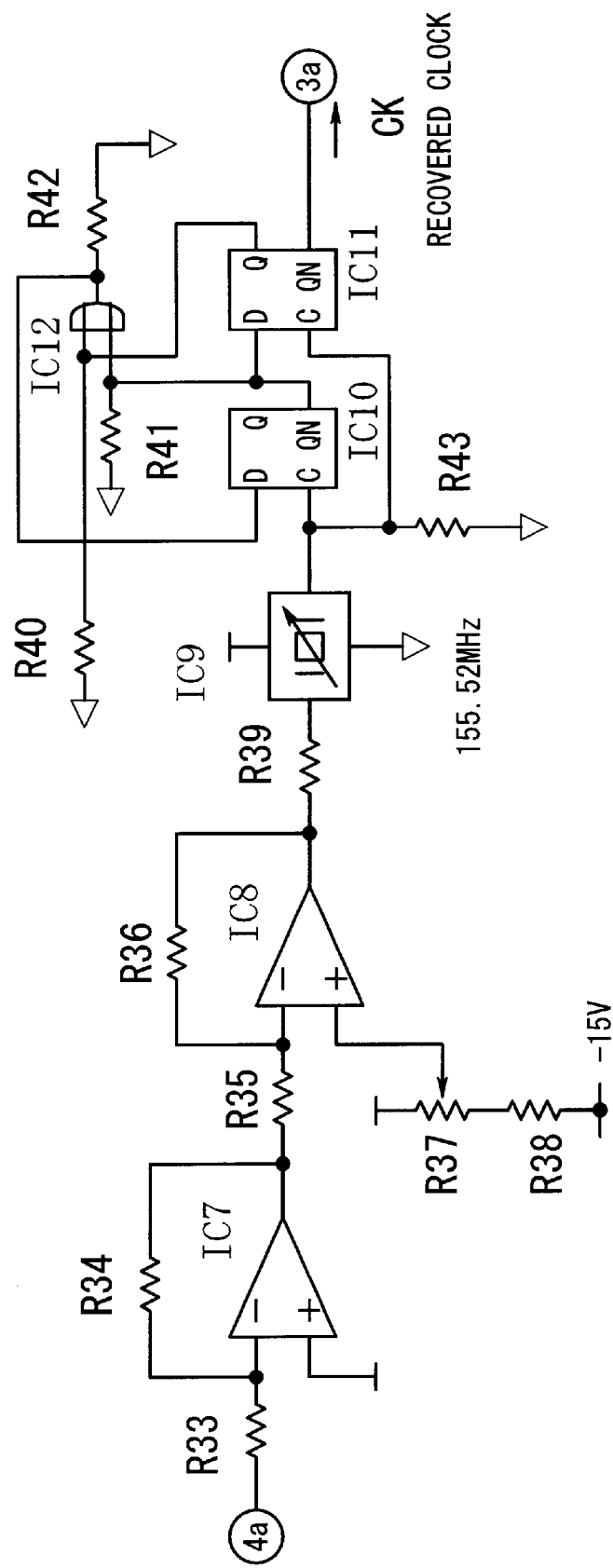
FIG. 6 is a diagram showing the configuration of the PLO circuit.

The following describes how operation was measured in designing the PLO device 1 of the present invention capable of operating properly under low S/N conditions. Referring to FIGS. 4 to 6, there is illustrated in detail the circuit configuration of the PLO circuit 7. The circuit shown in the figures uses a power supply voltage of −5.2 V to GND as a reference voltage and is constituted by discrete elements, ECL elements operating on −0.8 V to −1.6 V, etc. (for operational amplifiers and a divider (MPY634), the power supply voltage is −15 V and +15 V).

The connections of individual elements will be described. A resistor R1 has one end connected to GND, and has the other end connected to a signal input terminal and one end of a capacitor C1. Resistor R2 has one end connected to GND. The other end of the capacitor C1 is connected to the other end of the resistor R2, one end of a resistor R4, one input terminal of a logic element IC2, the D terminal of an FF IC1. The other end of the resistor R4 is connected to one end of a resistor R5, and the resistor R5 has the other end connected to −5.2 V.

The Q terminal of the FF IC1 is connected to the D terminal of an FF IC0, one terminal of each of the logic elements IC2 and IC3, and one end of a resistor R50. The Q terminal of the FF IC0 is connected to one end of a resistor R51 and the other input terminal of the logic element IC3. The resistors R50 and R51 each have the other end connected to −5.2 V.

The output terminal of the logic element IC2 is connected to one end of each of resistors R13 and R14, while the output terminal of the logic element IC3 is connected to one end of each of resistors R23 and R24. The resistor R13 has the other end connected to −5.2 V, and the resistor R14 has the other end connected to the base of a transistor Tr1. A resistor R15 has one end connected to GND and has the other end connected to the collector of the transistor Tr1. The emitter of the transistor Tr1 is connected to one end of a resistor R16 and the emitter of a transistor Tr2, the other end of the resistor R16 being connected to −5.2 V. A resistor R17 has one end connected to GND, and has the other end connected to the collector of the transistor Tr2, one end of a capacitor C7 and one end of a resistor R21. The other end of the capacitor C7 is connected to GND, and the base of the transistor Tr2 is connected to a resistor R18.

The resistor R18 has the other end connected to one end of each of resistors R19 and R20 and one end of a capacitor C3. The other end of the resistor R19 is connected to −5.2 V, the other end of the capacitor C3 is connected to GND, and the other end of the resistor R20 is connected to GND. The resistor R21 has the other end connected to the negative (−) terminal of an amplifier IC4 and one end of a resistor R22. The amplifier IC4 has the positive (+) terminal connected to GND, and the resistor R22 has the other end connected to the output terminal of the amplifier IC4 and the Z2 terminal of a divider IC6.

The other end of the resistor R23 is connected to −5.2 V, and the other end of the resistor R24 is connected to the base of a transistor Tr3. A resistor R25 has one end connected to GND and has the other end connected to the collector of the transistor Tr3. The emitter of the transistor Tr3 is connected to one end of a resistor R26 and the emitter of a transistor Tr4, the other end of the resistor R26 being connected to −5.2 V. A resistor R27 has one end connected to GND, and has the other end connected to the collector of the transistor Tr4, one end of a capacitor C4 and one end of a resistor R31. The other end of the capacitor C4 is connected to GND, and the base of the transistor Tr4 is connected to a resistor R28.

The resistor R28 has the other end connected to one end of each of resistors R29 and R30 and one end of a capacitor C5. The other end of the resistor R29 is connected to −5.2 V, the other end of the capacitor C5 is connected to GND, and the other end of the resistor R30 is connected to GND. The resistor R31 has the other end connected to the negative (−) terminal of an amplifier IC5 and one end of a resistor R32. The amplifier IC5 has the positive (+) terminal connected to GND, and the resistor R32 has the other end connected to the output terminal of the amplifier IC5 and the X1 terminal of the divider IC6.

The divider IC6 is connected to driving voltages of −15 V and +15 V each through a bypass capacitor, and has Z1, X2 and Y1 terminals connected to GND. The Y2 terminal is connected to the VOUT terminal as well as to one end of a resistor R33. The other end of the resistor R33 is connected to the negative (−) terminal of an amplifier IC7 and one end of a resistor R34, the positive (+) terminal of the amplifier IC7 being connected to GND. The resistor R34 has the other end connected to the output terminal of the amplifier IC7 and one end of a resistor R35.

The other end of the resistor R35 is connected to the negative (−) terminal of an amplifier IC8 and one end of a resistor R36, the positive (+) terminal of the amplifier IC8 being connected to a terminal of a resistor R37 whereby a variable resistance value is obtained. The resistor R37 has one end connected to GND and has the other end connected to one end of a resistor R38, the other end of which is connected to −15 V. The resistor R36 has the other end connected to the output terminal of the amplifier IC8 and one end of a resistor R39.

A VCO IC9, to the input terminal of which is connected the other end of the resistor R39, is connected to GND and −5.2 V as driving voltages and has the output terminal connected to one end of a resistor R43 and the clock input terminals of FFs IC10 and IC11. The other end of the resistor R43 is connected to −5.2 V.

The D terminal of the FF IC10 is connected to the output terminal of a logic element IC12 and one end of a resistor R42, the other end of R42 is connected to −5.2 V. The QN terminal of the FF IC10 is connected to one input terminal of the logic element IC12, one end of a resistor R41 and the D terminal of the FF IC11. A resistor R40 has one end connected to −5.2 V, and has the other end connected to the other input terminal of the logic element IC12 and the Q terminal of the FF IC11.

The QN terminal of the FF IC11 is connected to one end of a coaxial cable K2, the other end of which is connected to the clock input terminals of the FFs IC1 and IC0 and one end of a resistor R11. The other end of the resistor R11 is connected to one end of a resistor R12 and one end of a capacitor C2. The resistor R12 has the other end connected to −5.2 V, while the capacitor C2 has the other end connected to GND.

Figure 7:
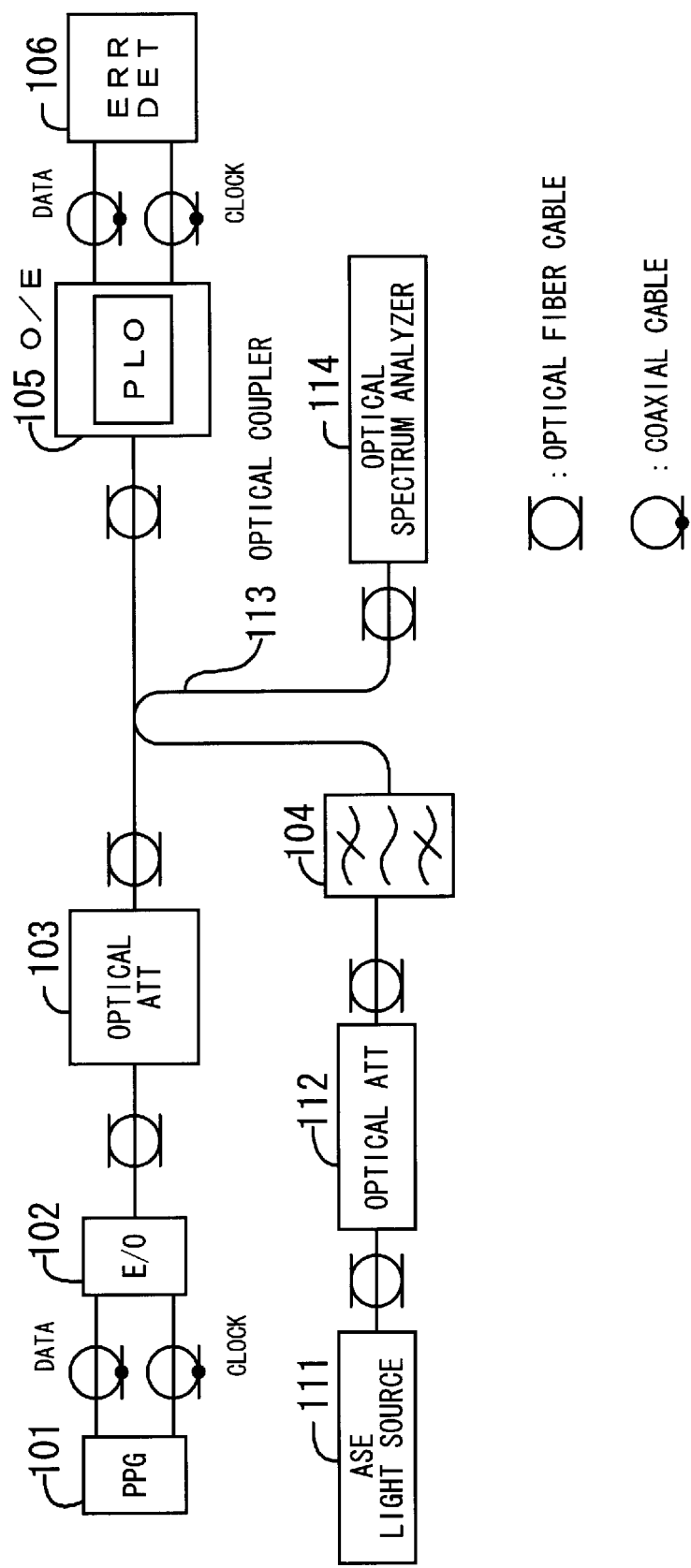
FIG. 7 is a diagram showing a configuration of a measurement system.

Input data is input to the signal input terminal of the PLO circuit 7 shown in FIGS. 4 to 6 at a transmission rate of 52.84 Mb/s with the use of a π-phase external clock (with the loop opened), and using a measurement system shown in FIG. 7, waveforms of the PLO circuit 7 are observed with OSNR (Optical Signal Noise Ratio: S/N in light region) changed to vary the S/N of the input signal.

FIG. 7 shows the configuration of the measurement system, which comprises a PPG (Pulse Pattern Generator) 101, an E/O 102, optical attenuators 103 and 112, an optical coupler 113, an optical band-pass filter 104, an O/E 105 (including the PLO circuit 7), an error detector 106, an ASE (Amplified Spontaneous Emission) light source 111, and an optical spectrum analyzer 114. Coaxial cables are used to connect elements between which electrical signal is transmitted, and optical fiber cables are used to connect elements between which optical signal is transmitted.

The PPG 101 outputs a clock signal as well as a test pattern signal (in this example, at 52.84 Mb/s). The E/O 102 converts the received signals to light, and the optical attenuator 103 attenuates the light.

The ASE light source 111 radiates ASE, which is noise light, and the optical attenuator 112 attenuates the ASE. To make the ASE light localized around the signal light, the optical band-pass filter is arranged at a stage succeeding the optical attenuator 112. The optical coupler 113 combines the output light from the optical attenuator 103 with the output light from the optical attenuator 112, and transmits the combined light to the optical band-pass filter 104. Also, the optical coupler 113 transmits the combined light to the optical spectrum analyzer 114.

The light from the optical coupler 113 is converted to electrical signals at the O/E 105. The O/E 105 transmits the data and also the clock recovered by the PLO circuit 7 to the error detector 106, which then detects an error rate.

Figure 8:
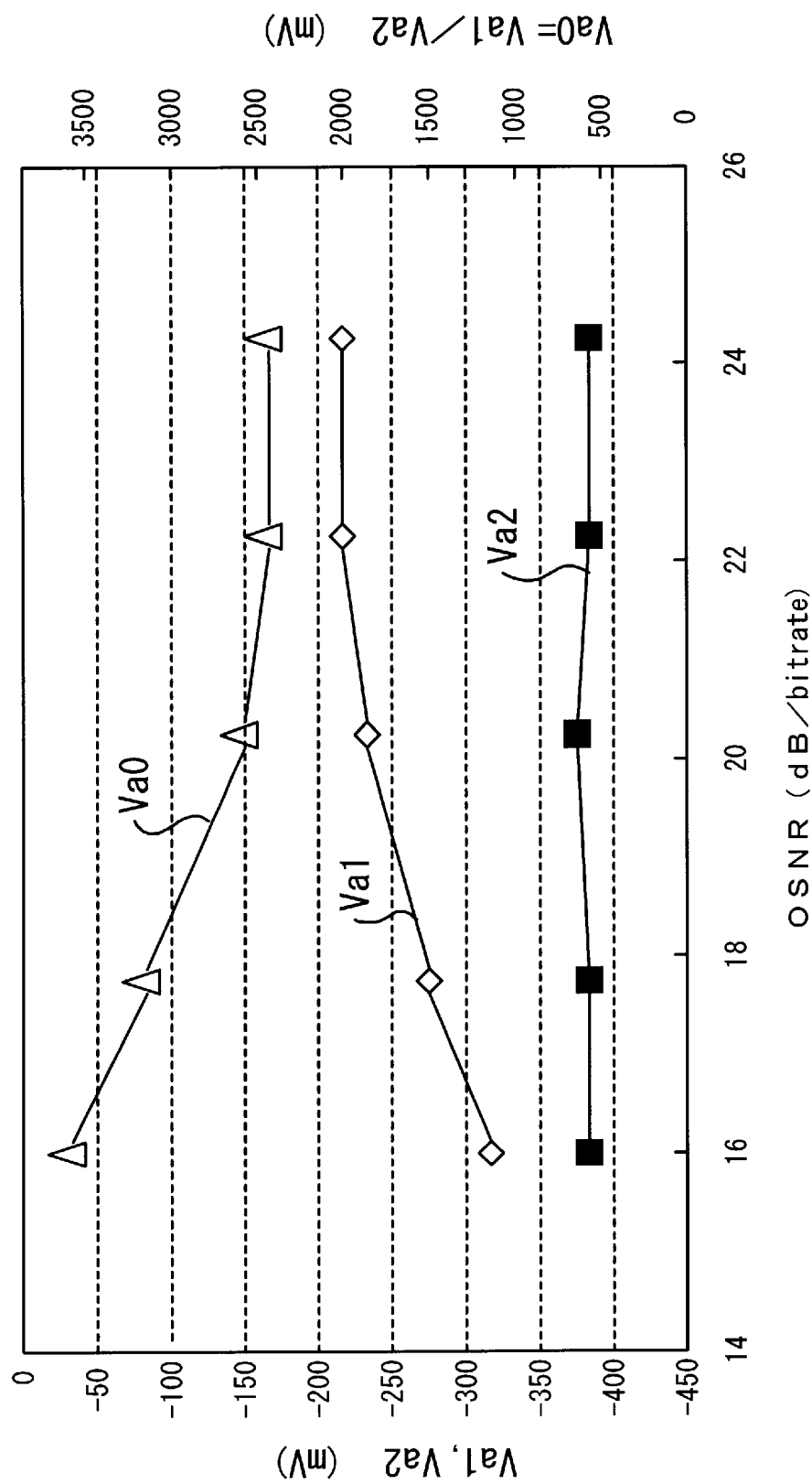
FIG. 8 is a diagram showing measured values of detection voltages and control voltage of the PLO circuit.
Figure 9:
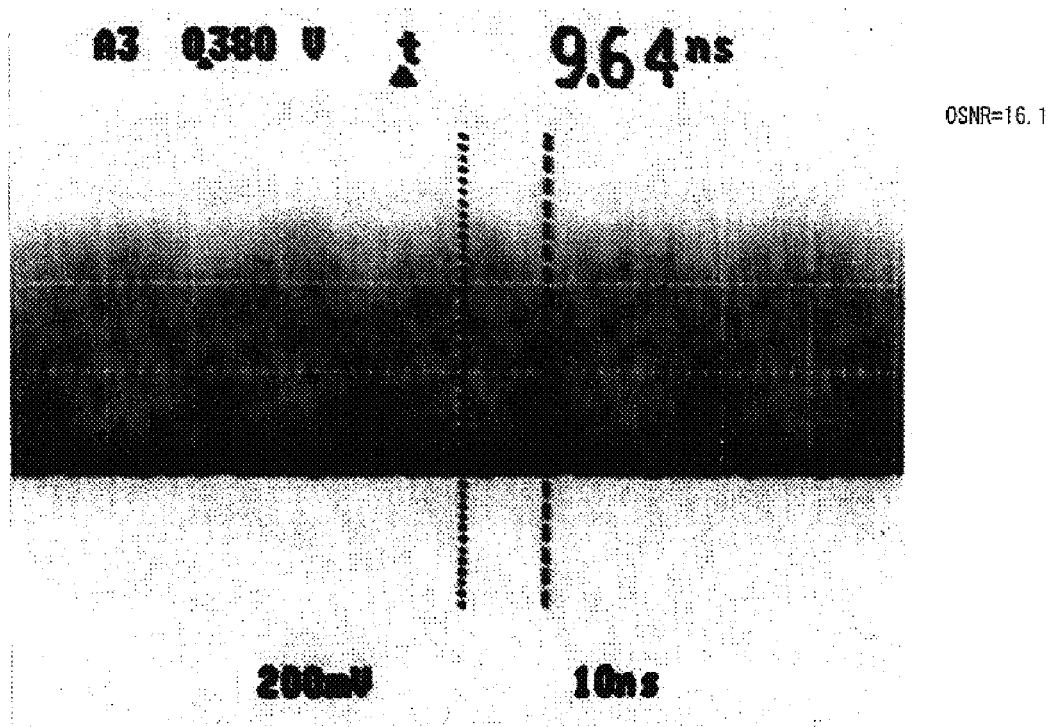
FIGS. 9 through 23 show observed waveforms of the PLO circuit.
Figure 10:
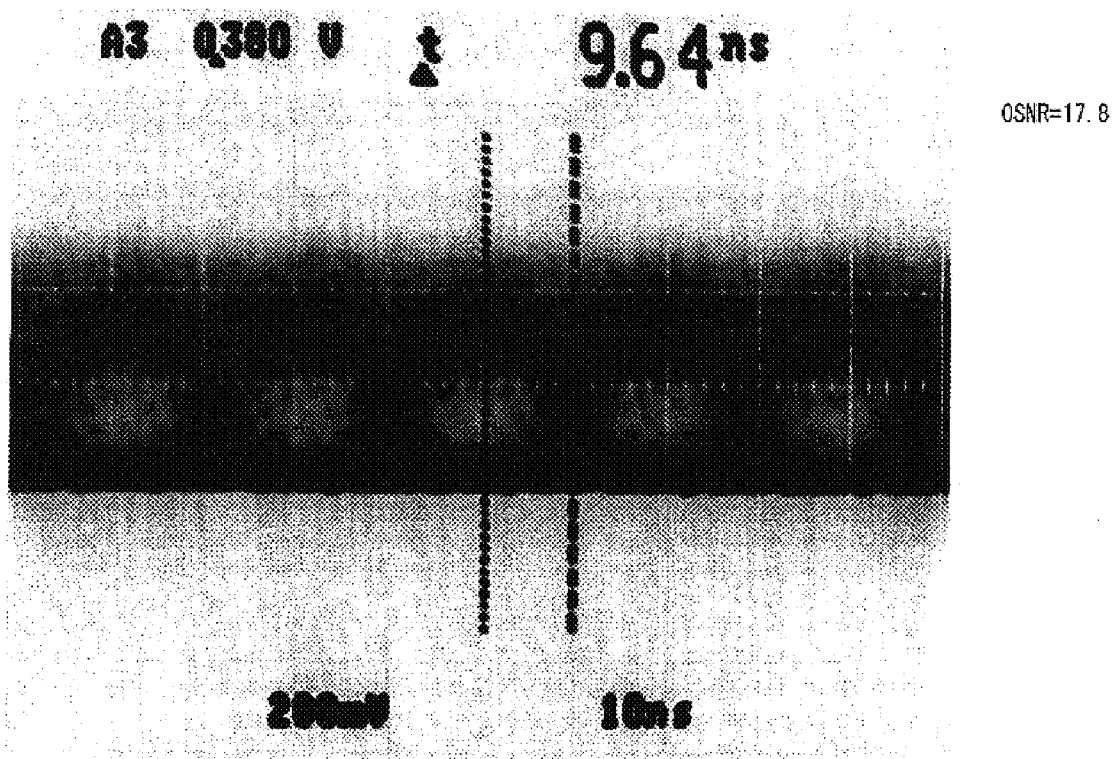
Figure 11:
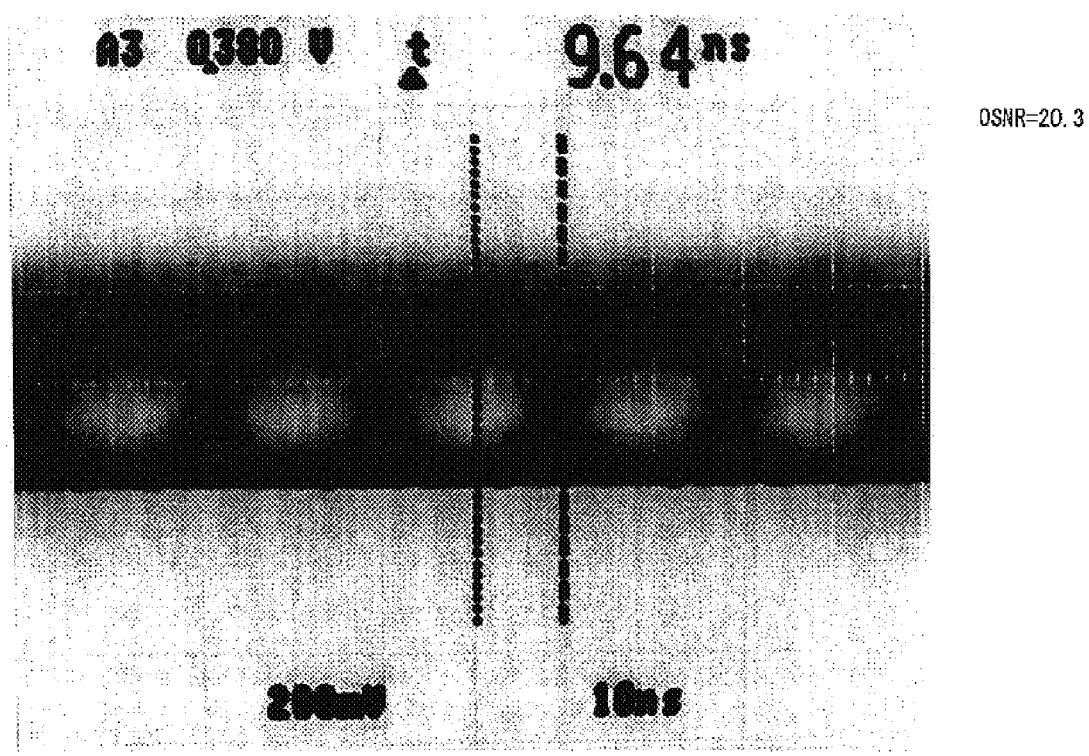
Figure 12:
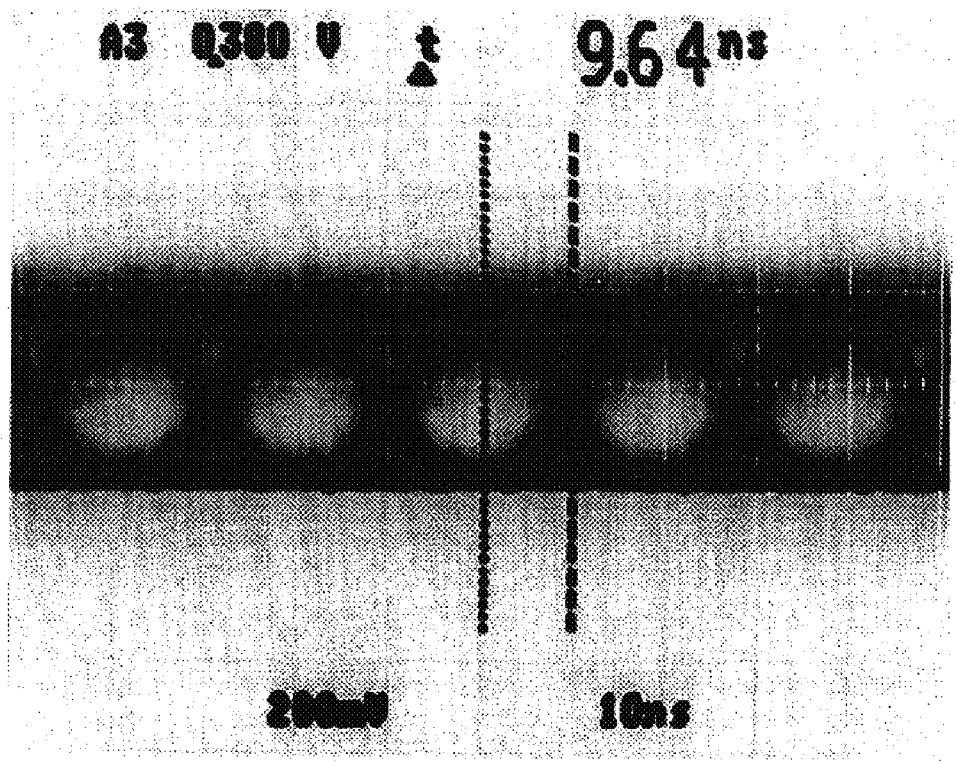
Figure 13:
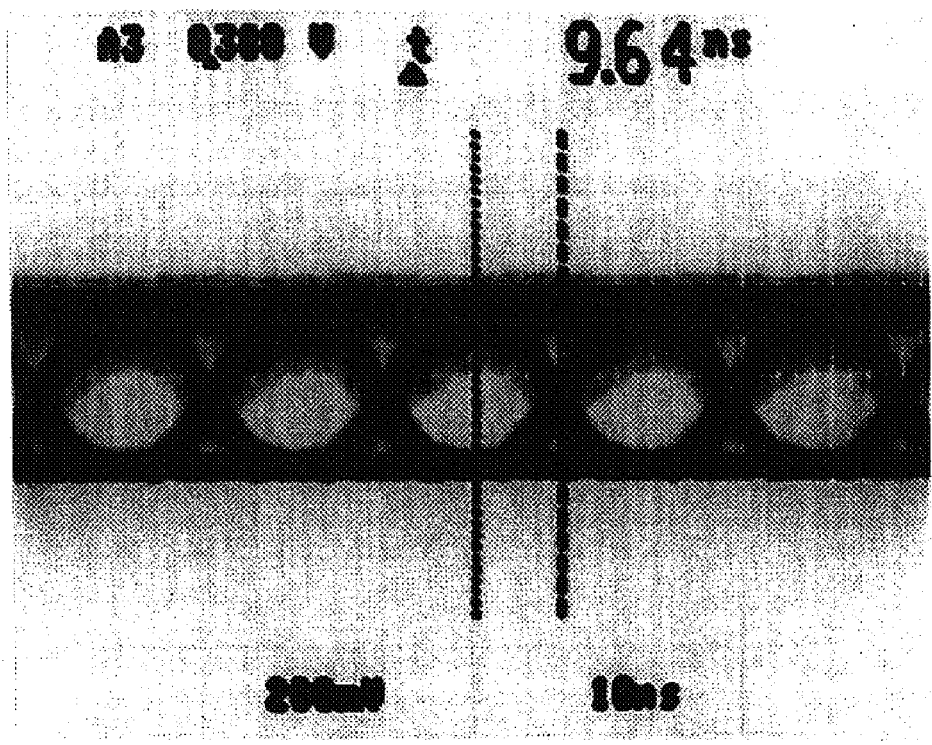
Figure 14:
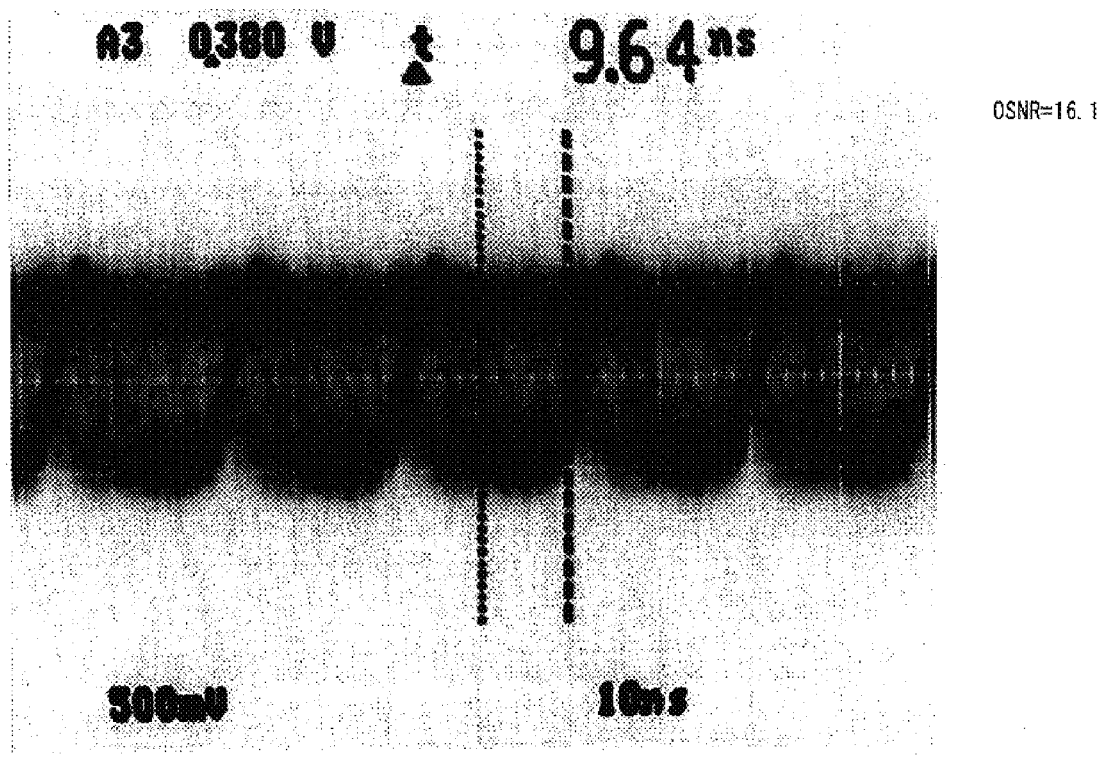
Figure 15:
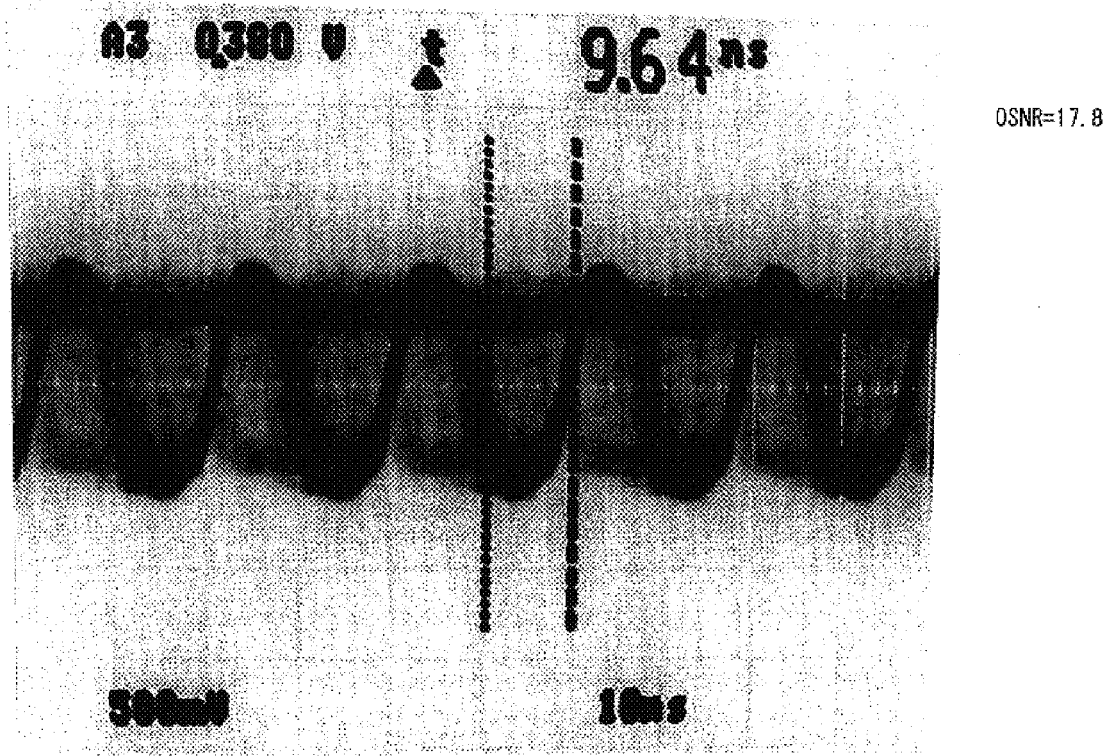
Figure 16:
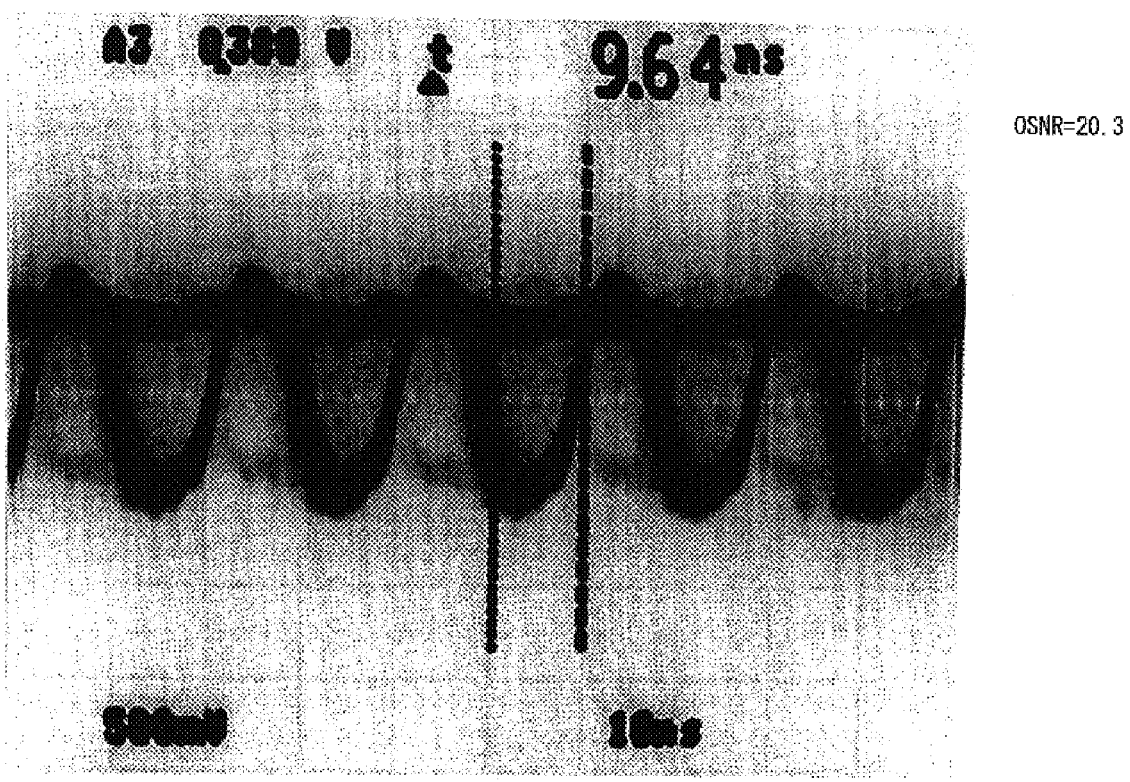
Figure 17:
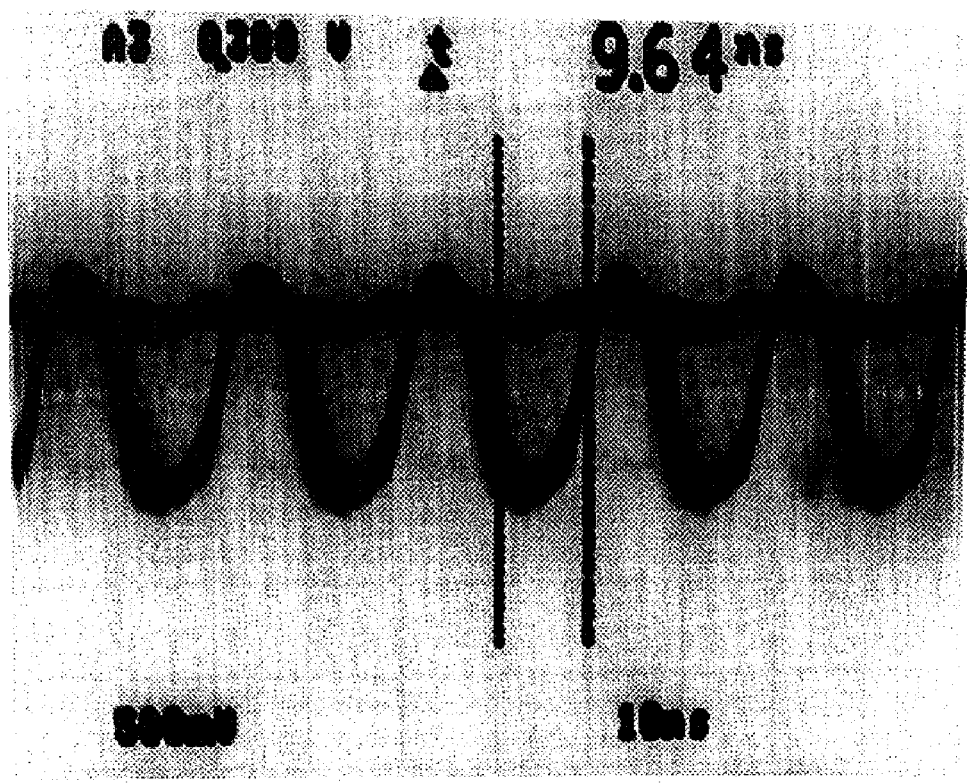
Figure 18:
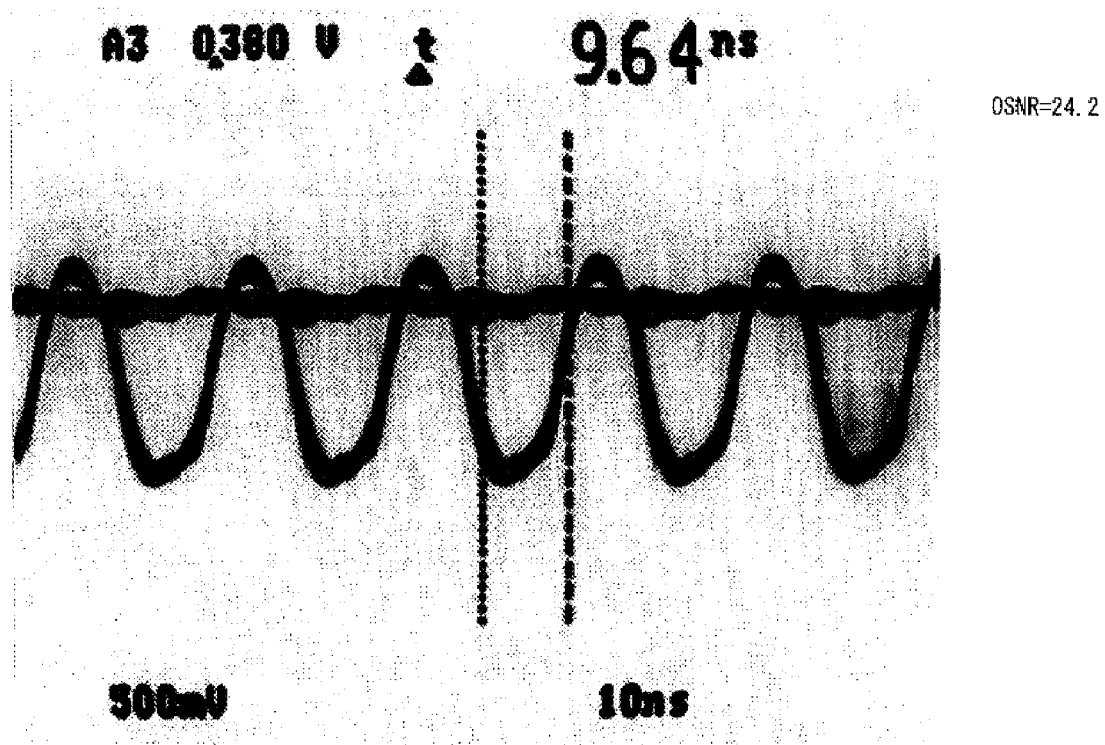
Figure 19:
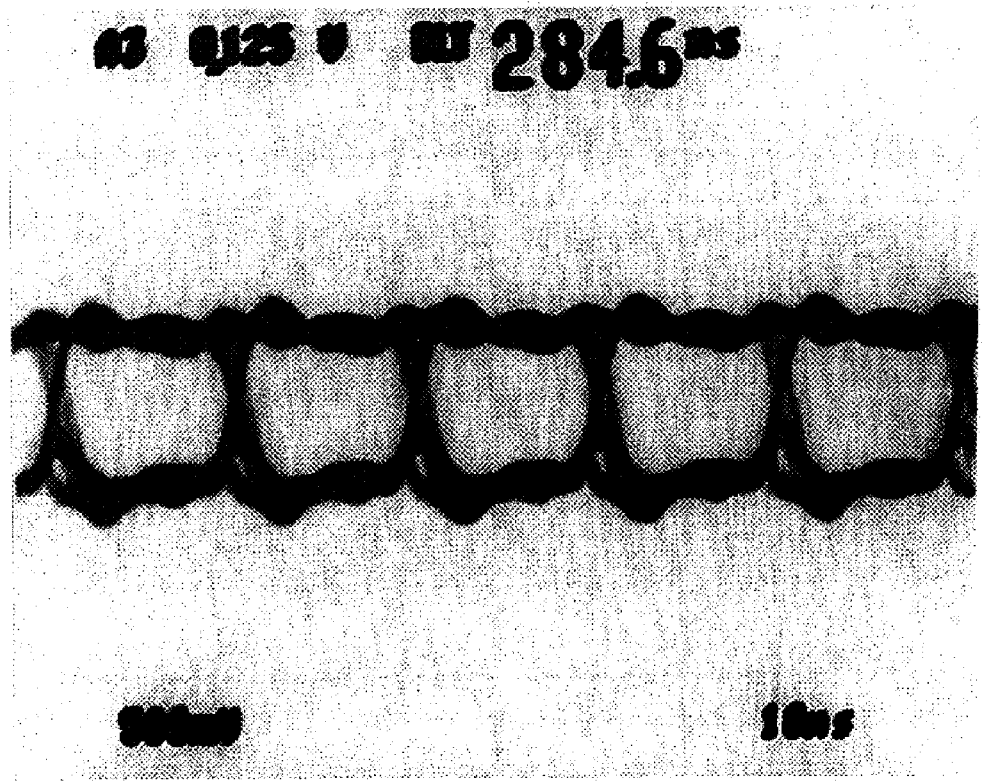
Figure 20:
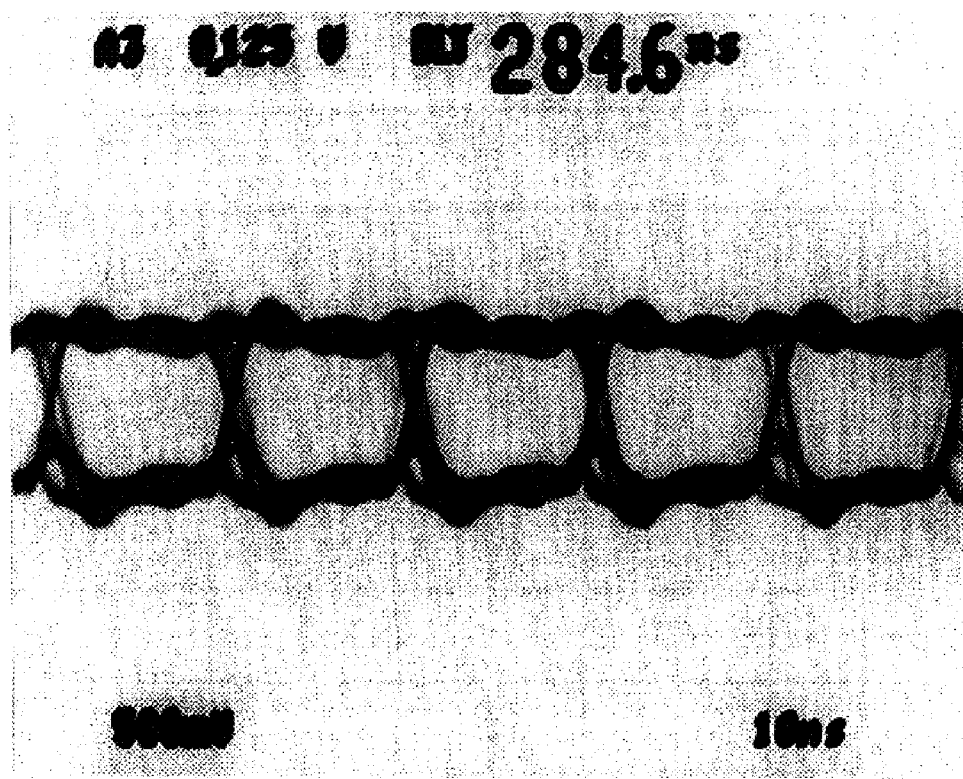
Figure 21:
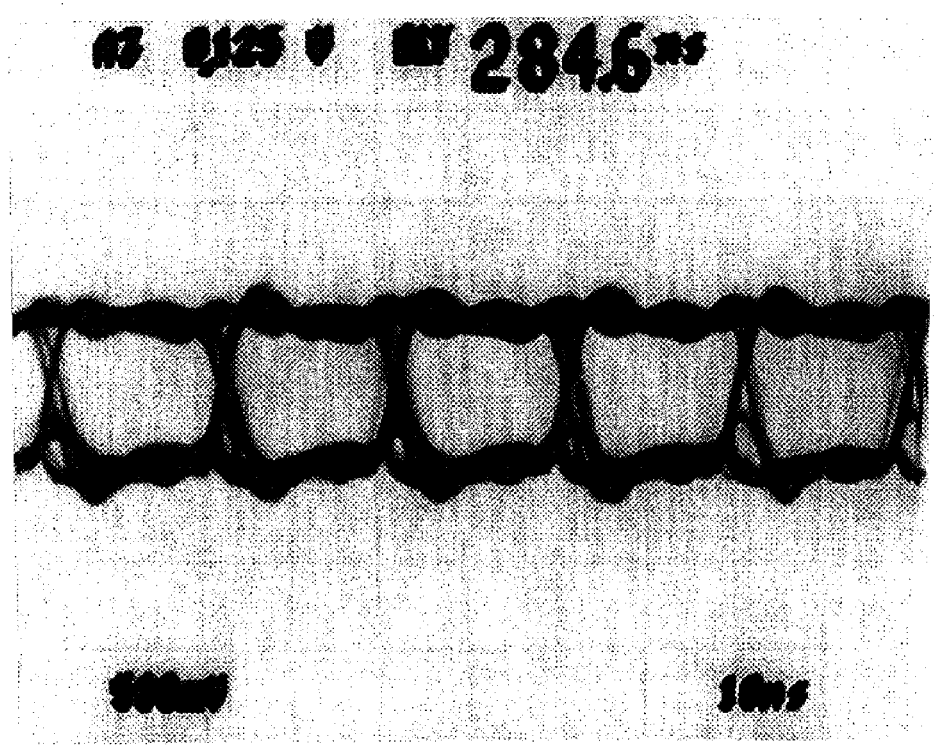
Figure 22:
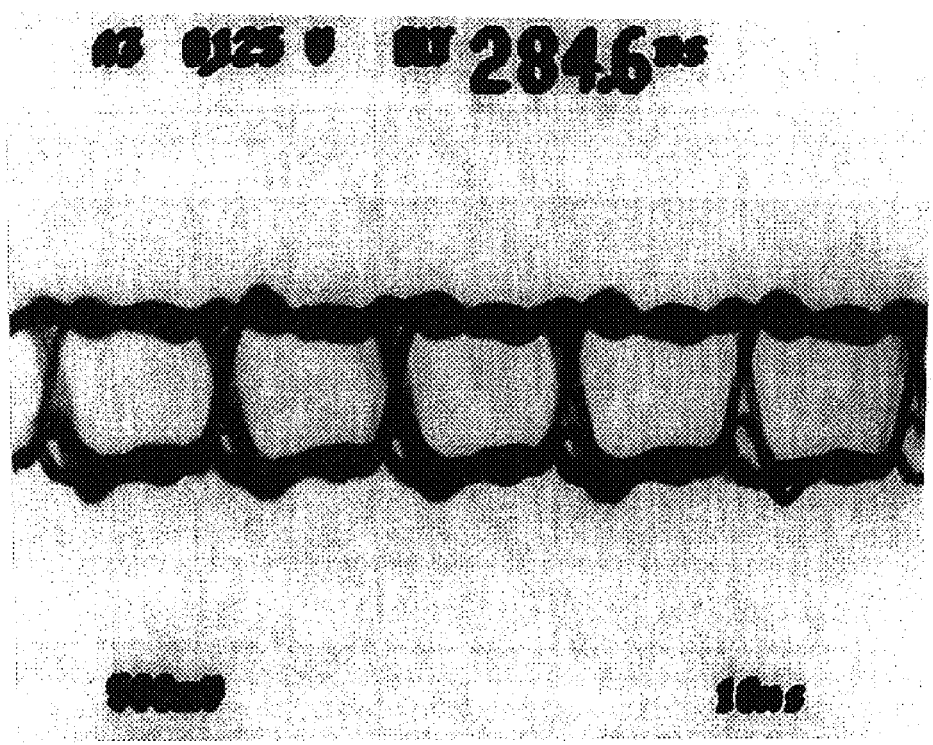
Figure 23:
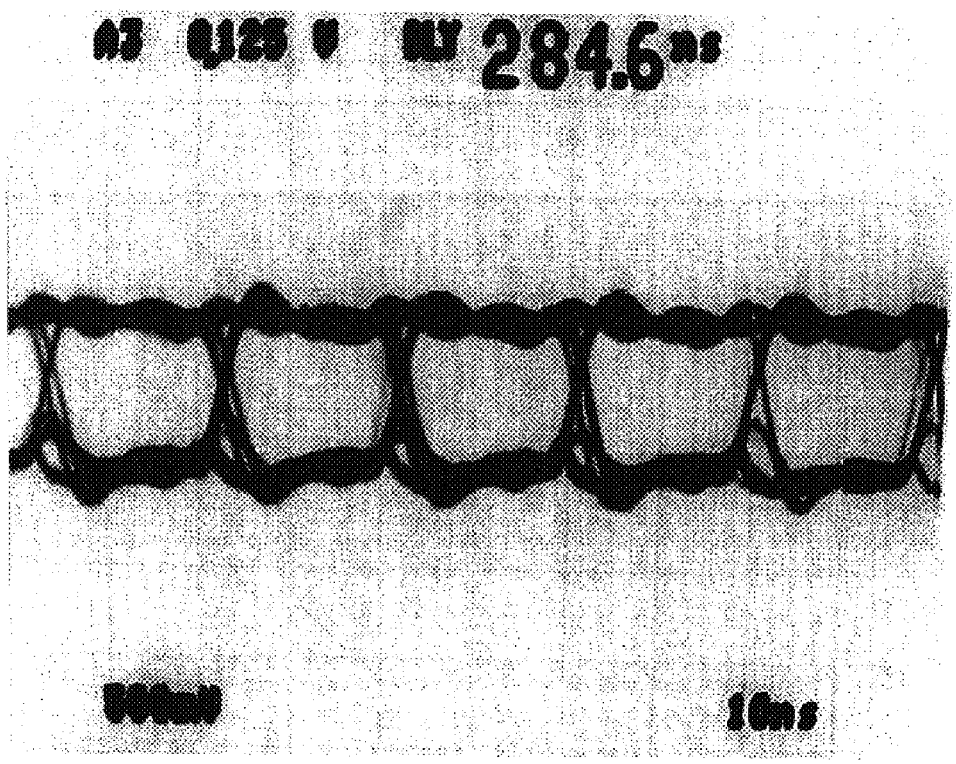

FIG. 8 shows measured values of the detection voltages and control voltage of the PLO circuit 7. With the π-phase clock signal introduced from outside, the detection voltages Va1 and Va2 and control voltage Va0 of the PLO circuit 7 were measured using the measurement system shown in FIG. 7. The left-hand vertical axis indicates the voltage value (mV) of the detection voltages Va1 and Va2, the right-hand vertical axis indicates the voltage value (mV) of the control voltage Va0, and the horizontal axis indicates the OSNR (dB/bitrate).

While the OSNR is relatively high (above 20 dB), the control voltage Va0 is constant (flat) and thus the PLO circuit 7 can operate normally. However, if the OSNR deteriorates (below 20 dB), the detection voltage Va1 starts to lower. Also, since the relationship (control voltage Va0)= (detection voltage Va1)÷(detection voltage Va2) holds, the control voltage Va0 starts to rise. Namely, as the OSNR deteriorates, the control voltage Va0 starts to rise from a constant value and malfunction of the PLO circuit 7, such as out-of-phase error, occurs.

Thus, to make the circuit operate normally even under poor OSNR conditions, the control voltage Va0 should remain flat under poor OSNR conditions. Specifically, in the OSNR range below 20 dB, the detection voltage Va1 may be raised so as to remain flat, or the detection voltage Va2 may be lowered along a curve similar to that of the detection voltage Va1 (either of the two meets the need because the control voltage Va0 is the result of the division of the detection voltage Va1 by the detection voltage Va2).

Compared with the first measure, the second measure, that is, "lowering the detection voltage Va2 along a curve similar to that of the detection voltage Va1", is easier to perform; therefore, in the present invention, the second measure was selected to design the circuit.

Observed waveforms of the PLO circuit 7 will be now described. The waveform of the difference data B3 (corresponding to the output signal of the logic element IC2 in the circuit shown in FIG. 4) derived prior to the generation of the detection voltage Va1 and the waveform of the difference data B4 (corresponding to the output signal of the logic element IC3 in the circuit shown in FIG. 4) derived prior to the generation of the detection voltage Va2 are observed using an oscilloscope, whereupon an eye pattern is observed.

If the signal is free of waveform distortion, the eye pattern has a large opening. If the waveform is distorted due to noise, the slopes and corners of the eye pattern become rounded, and also since jitter causes a shift of time base, the opening of the eye pattern reduces.

Under satisfactory OSNR conditions, the difference data B3 shows an eye pattern with a large opening, but as the OSNR deteriorates, the opening of the observed waveform reduces. In the case of the difference data B4 which is the result of logical operation on the data supplied from the FFs IC1 and IC0, the waveform observed has a large opening irrespective of the OSNR conditions.

FIGS. 9 through 23 show observed waveforms of the PLO circuit 7, wherein the division of voltage is 200 mV and the division of time is 10 ns. FIGS. 9 to 13 show waveform eye patterns of the input data B1 (corresponding to the data input to the signal input terminal of the circuit shown in FIG. 4), FIGS. 14 to 18 show waveform eye patterns of the difference data B3 (output signal of the logic element IC2), and FIGS. 19 to 23 show waveform eye patterns of the difference data B4 (output signal of the logic element IC3).

From FIGS. 9 to 13 showing the input data B1 and FIGS. 14 to 18 showing the difference data B3, it is apparent that as the OSNR improves from 16.1 dB to 24.2 dB, the opening enlarges. The difference data B4 shown in FIGS. 19 to 23 is the signal derived through the FFs and thus contains no S/N-related parameter, so that the opening is large independent of the OSNR value.

The following describes how the voltage curves shown in FIG. 8 can be represented by equations. The detection voltage Va1 is a function of three parameters related to transition rate, phase difference and S/N, while the detection voltage Va2 is a function of the transition rate-related parameter, and this can be represented by equations (1) and (2) below. In equation (1), f(S/N) denotes an S/N-dependent function.

(Detection voltage $Va1$)=(Transition rate)·(Phase difference)·$f(S/N)$     (1)

(Detection voltage $Va2$)=(Transition rate)·$2\pi$     (2)

The control voltage Va0, obtained by the division of these voltages, is indicated by equation (3) below.

(Control voltage $Va0$)=((Phase difference)·$f(S/N)$)/$2\pi$     (3)

As will be understood from equation (3), the control voltage Va0 contains the S/N-related parameter. Therefore, as the S/N deteriorates, the control voltage Va0 varies, and if the S/N lowers to a certain level, the clock can no longer be maintained in-phase, causing out-of-phase error.

To remove the term relating to S/N from equation (3), the S/N-related parameter may be included in equation (2) (the relationship (Detection voltage Va2)∝(Transition rate)·f(S/N) may be established).

Figure 24:
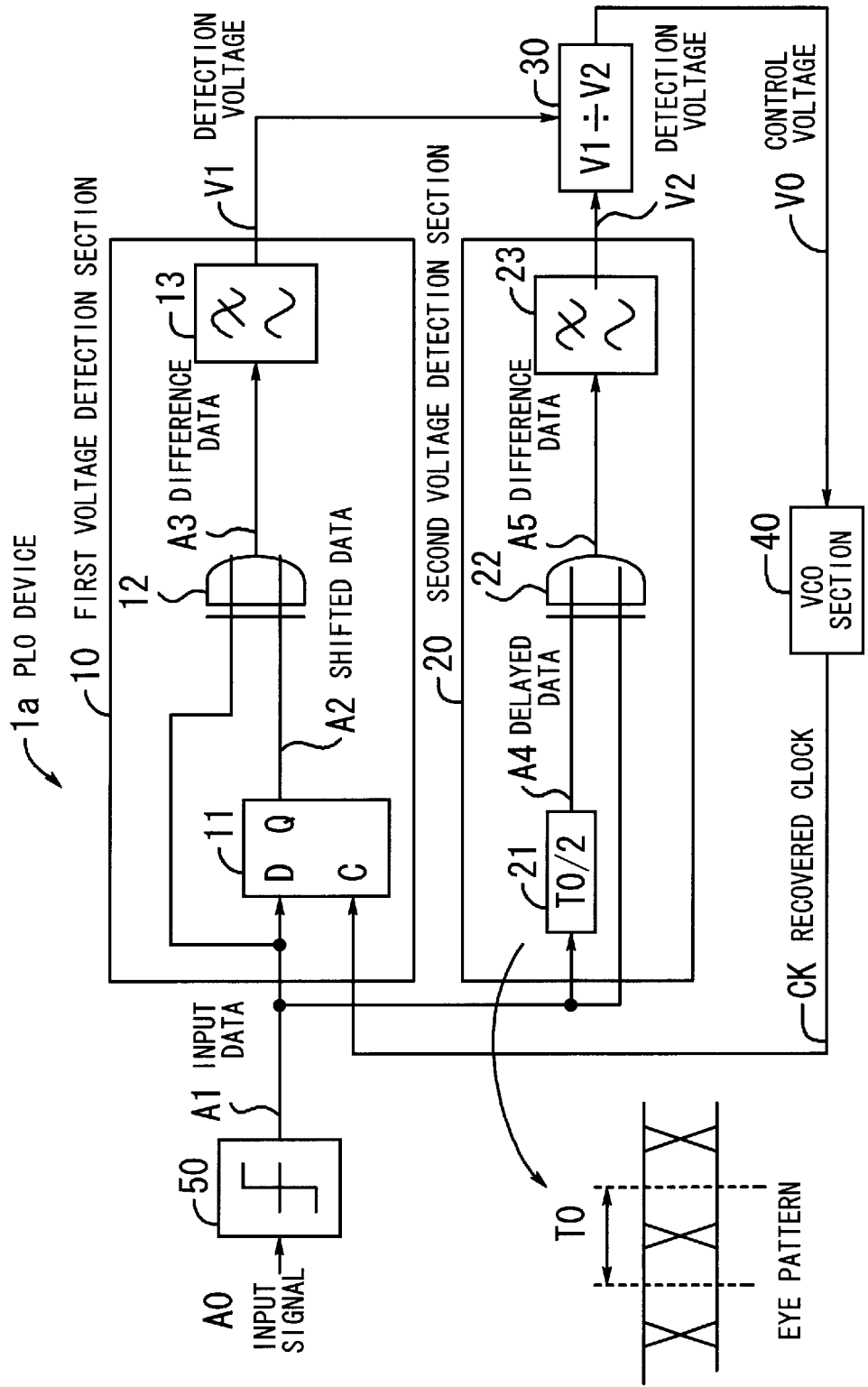
FIG. 24 is a diagram showing a circuit configuration of a PLO device.

The configuration and operation of the PLO device 1 of the present invention, in which the relationship (Detection voltage Va2)∝(Transition rate)·f(S/N) is incorporated, will be now described. FIG. 24 shows the configuration of such a PLO device. A PLO device 1a comprises a first voltage detection section 10, a second voltage detection section 20, an arithmetic section 30, a VCO section 40 (corresponding to the clock oscillation section 40), and a discriminator 50.

The first voltage detection section 10 includes an FF 11 (corresponding to the shifted data generation part 11), an EOR 12 (corresponding to the first phase comparison part 12), and a low-pass filter 13 (corresponding to the first filter 13). The second voltage detection section 20 includes a delay part 21, an EOR 22 (second phase comparison part 22), and a low-pass filter 23 (second filter 23).

The connections of the individual elements will be described. The output of the discriminator 50 is connected to the D terminal of the FF11, one input terminal of each of the EORs 12 and 22, and the delay part 21. The Q terminal of the FF 11 is connected to the other terminal of the EOR 12, whose output is input to the low-pass filter 13. The output of the low-pass filter 13 is input to the arithmetic section 30.

The output of the delay part 21 is connected to the other input terminal of the EOR 22. The output of the EOR 22 is input to the low-pass filter 23, the output of which is input to the arithmetic section 30. The output of the arithmetic section 30 is input to the VCO section 40. The output of the VCO section 40 is connected to the clock input terminal of the FF 11.

The discriminator 50 discriminates between "0" and "1" of input signal A0. The FF 11 shifts input data A1 for a time corresponding to half of one time slot and outputs shifted data A2. The EOR 12 detects a phase difference between the two, phase-shifted and unshifted signals, and outputs difference data A3. The low-pass filter 13 removes an alternating-current component from the difference data A3 and outputs a direct-current detection voltage V1.

The delay part 21 shifts the input data A1 for a time (=T0/2) corresponding to half of one time slot by means of an analog delay element (e.g. coaxial cable), and outputs delayed data A4.

The EOR 22 detects a phase difference between the two, phase-shifted and unshifted signals, and outputs difference data A5. The low-pass filter 23 removes an alternating-current component from the difference data A5 and outputs a direct-current detection voltage V2.

The arithmetic section 30 divides the detection voltage V1 by the detection voltage V2 to obtain a control voltage V0.

The VCO section 40 oscillates at an output frequency (input clock for the FF 11) proportional to the control voltage V0 from which high-frequency component has been removed.

Comparison between the PLO circuit 7 shown in FIG. 2 and the PLO device 1*a* shown in FIG. 24 reveals that the second voltage detection section 20 of the PLO device 1*a* uses an analog delay element, in place of a flip-flop, to delay the input data A1 so that the detection voltage V2 may contain the S/N-related parameter.

Specifically, in the PLO circuit 7 of FIG. 2, the input data is delayed by a flip-flop to obtain the difference data B4, and thus the difference data B4 is not dependent on the S/N. This means that if the input data is delayed without using a flip-flop, the difference data can be made to contain the S/N-related parameter. Thus, the PLO device 1*a* of FIG. 24 uses an analog delay element, instead of a flip-flop, to obtain the difference data A5 which is dependent on the SIN.

Figure 25:
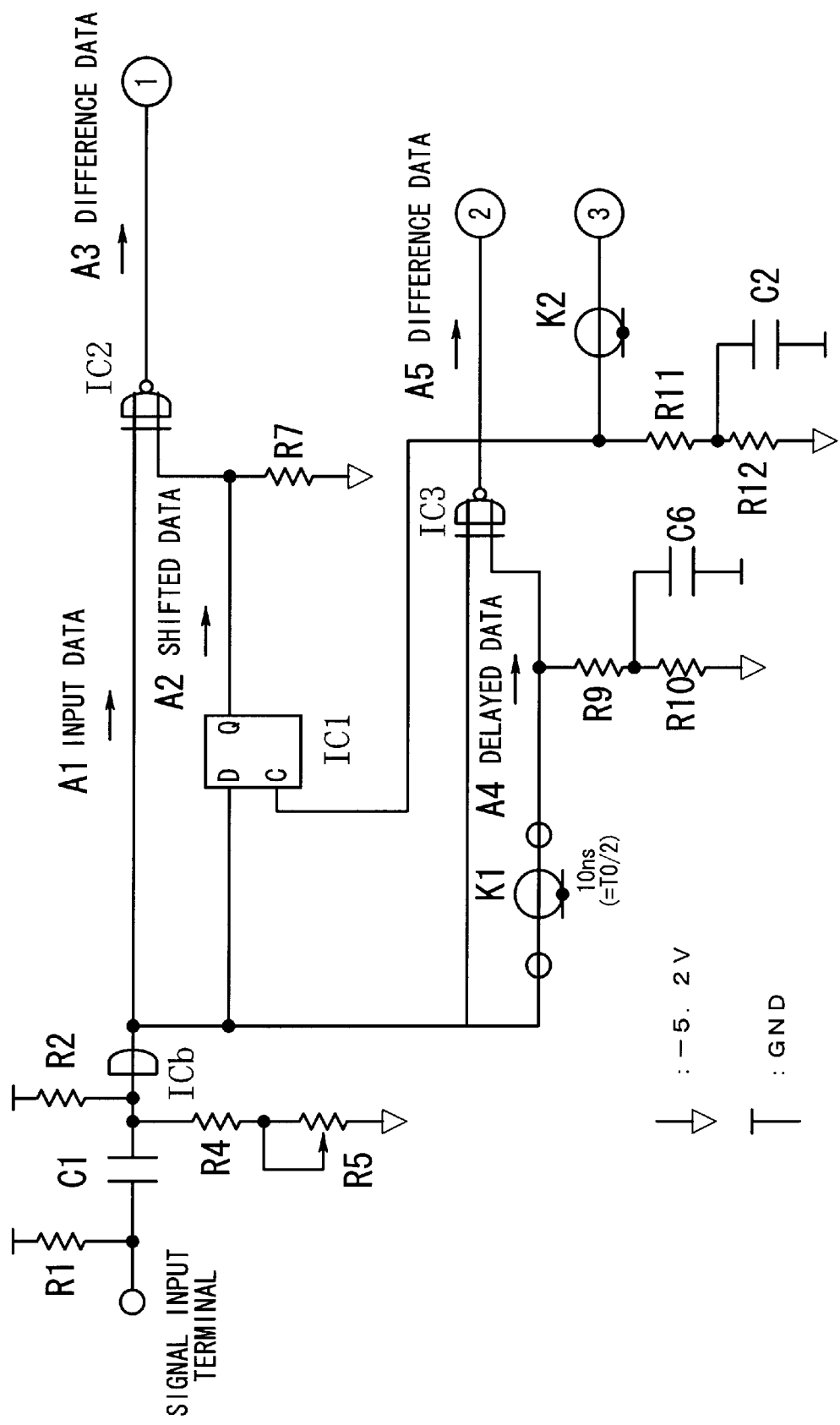
FIG. 25 is a diagram showing the circuit configuration of the PLO device.
Figure 26:
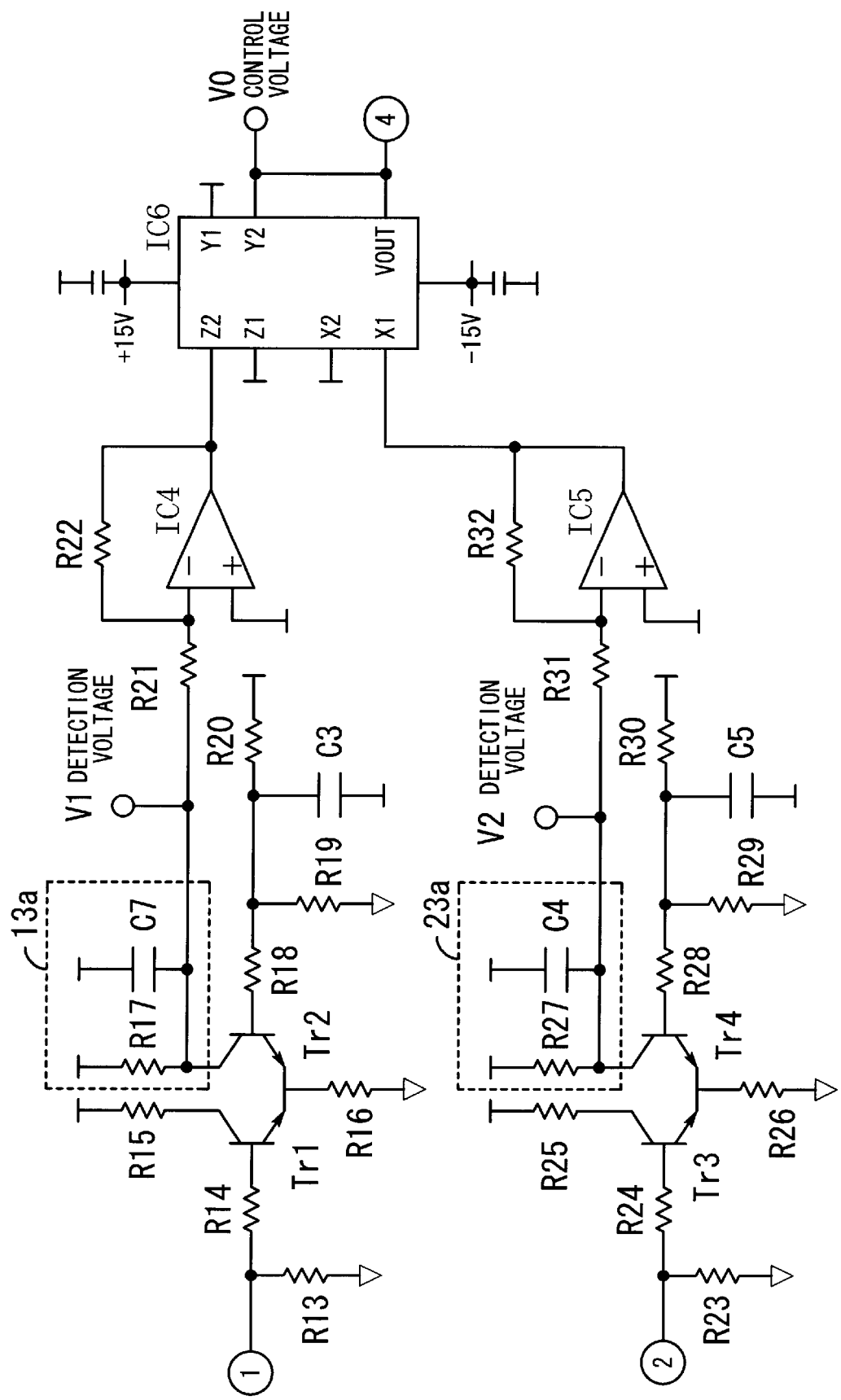
FIG. 26 is a diagram showing the circuit configuration of the PLO device.
Figure 27:
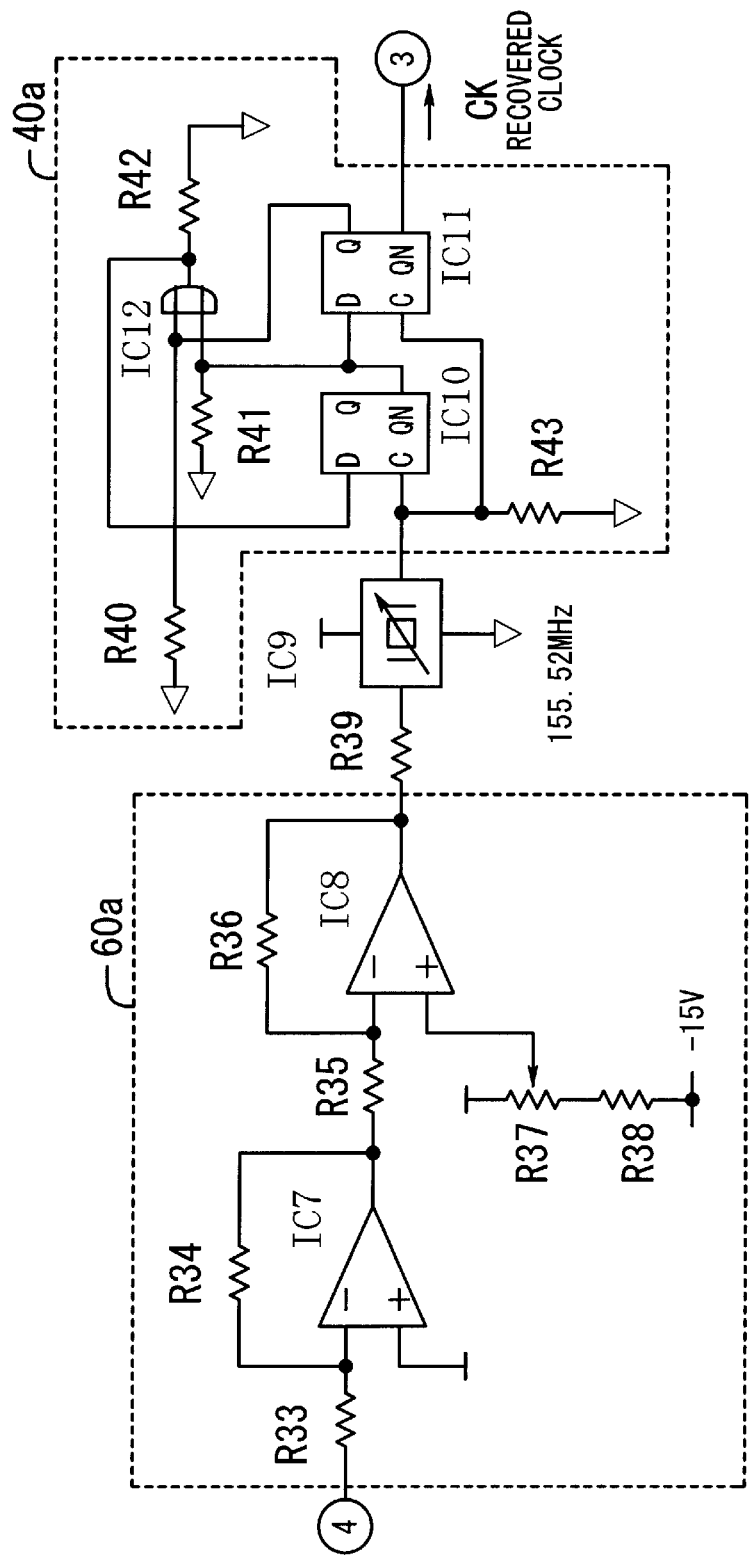
FIG. 27 is a diagram showing the configuration of the PLO device.

A specific circuit configuration of the PLO device 1*a* will be now described. FIGS. 25 to 27 show the circuit configuration of the PLO device 1*a*. The circuit shown in the figures uses a power supply voltage of −5.2 V to GND as a reference voltage and is constituted by discrete elements, ECL elements operating on −0.8 V to −1.6 V, etc. (for operational amplifiers and a divider (MPY634), the power supply voltage is −15 V and +15 V).

An FF IC1 corresponds to the FF 11, and logic elements IC2 and IC3 correspond respectively to the EORs 12 and 22 (in the illustrated example, negative outputs are provided and the outputs are subjected to level conversion in transistors Tr1, Tr2 and Tr3, Tr4 of succeeding stages). A coaxial cable K1 corresponds to the delay part 21 and has a cable length of 2 m to delay data for 10 ns (a cable length of 20 cm provides a delay of 1 ns).

A low-pass filter 13*a* constituted by a resistor R17 and a capacitor C7 corresponds to the low-pass filter 13, while a low-pass filter 23*a* constituted by a resistor R27 and a capacitor C4 corresponds to the low-pass filter 23 (the output signals of the low-pass filters 13*a* and 23*a* are amplified by amplifiers IC4 and IC5, respectively).

A divider IC6 corresponds to the arithmetic section 30, and the output from the divider IC6 is converted to a direct-current level by a direct-current level converter 60*a*. A VCO IC9 corresponds to the VCO section 40 (for the VCO IC9, an element capable of oscillation at 155.52 MHz is used, and accordingly, a circuit 40*a* for performing a division (÷3) is provided at a succeeding stage to output recovered clock CK of 52.84 Mb/s).

The connections of the individual elements will be described. A resistor R1 has one end connected to GND, and has the other end connected to a signal input terminal and one end of a capacitor C1. A resistor R2 has one end connected to GND. The other end of the capacitor C1 is connected to the other end of the resistor R2, one end of a resistor R4 and the input of a logic element ICb. The output of the logic element ICb is connected to one input terminal of the logic element IC2, the 0 terminal of the FF IC1, one input terminal of the logic element IC3, and one end of the coaxial cable K1. The other end of the resistor R4 is connected to one end of a resistor R5, the other end of R5 is connected to −5.2 V. The Q terminal of the FF IC1 is connected to the other input terminal of the logic element IC2 and one end of a resistor R7. The other end of the resistor R7 is connected to −5.2 V.

The other end of the coaxial cable K1 is connected to one end of a resistor R9 and the other input terminal of the logic element IC3, and the other end of the resistor R9 is connected to one end of a resistor R10 and one end of a capacitor C6. The resistor R10 has the other end connected to −5.2 V, while the capacitor C6 has the other end connected to GND.

The output terminal of the logic element IC2 is connected to one end of each of resistors R13 and R14, while the output terminal of the logic element IC3 is connected to one end of each of resistors R23 and R24. The resistor R13 has the other end connected to −5.2 V, and the resistor R14 has the other end connected to the base of the transistor Tr1. A resistor R15 has one end connected to GND and has the other end connected to the collector of the transistor Tr1. The emitter of the transistor Tr1 is connected to one end of a resistor R16 and the emitter of the transistor Tr2, the other end of the resistor R16 being connected to −5.2 V. The resistor R17 has one end connected to GND, and has the other end connected to the collector of the transistor Tr2, one end of the capacitor C7 and one end of a resistor R21. The other end of the capacitor C7 is connected to GND, and the base of the transistor Tr2 is connected to a resistor R18.

The resistor R18 has the other end connected to one end of each of resistors R19 and R20 and one end of a capacitor C3. The other end of the resistor R19 is connected to −5.2 V, the other end of the capacitor C3 is connected to GND, and the other end of the resistor R20 is connected to GND. The resistor R21 has the other end connected to the negative (−) terminal of the amplifier IC4 and one end of a resistor R22. The amplifier IC4 has the positive (+) terminal connected to GND, and the resistor R22 has the other end connected to the output terminal of the amplifier IC4 and the Z2 terminal of the divider IC6.

The other end of the resistor R23 is connected to −5.2 V, and the other end of the resistor R24 is connected to the base of the transistor Tr3. A resistor R25 has one end connected to GND and has the other end connected to the collector of the transistor Tr3. The emitter of the transistor Tr3 is connected to one end of a resistor R26 and the emitter of the transistor Tr4, the other end of the resistor R26 being connected to −5.2 V. The resistor R27 has one end connected to GND, and has the other end connected to the collector of the transistor Tr4, one end of the capacitor C4 and one end of a resistor R31. The other end of the capacitor C4 is connected to GND, and the base of the transistor Tr4 is connected to a resistor R28.

The resistor R28 has the other end connected to one end of each of resistors R29 and R30 and one end of a capacitor C5. The other end of the resistor R29 is connected to −5.2 V, the other end of the capacitor C5 is connected to GND, and the other end of the resistor R30 is connected to GND. The resistor R31 has the other end connected to the negative (−) terminal of the amplifier IC5 and one end of a resistor R32. The amplifier IC5 has the positive (+) terminal connected to GND, and the resistor R32 has the other end connected to the output terminal of the amplifier IC5 and the X1 terminal of the divider IC6.

The divider IC6 is connected to driving voltages of −15 V and +15 V each through a bypass capacitor, and has Z1, X2 and Y1 terminals connected to GND. The Y2 terminal is connected to the VOUT terminal as well as to one end of a resistor R33. The other end of the resistor R33 is connected to the negative (−) terminal of an amplifier IC7 and one end of a resistor R34, the positive (+) terminal of the amplifier IC7 being connected to GND. The resistor R34 has the other end connected to the output terminal of the amplifier IC7 and one end of a resistor R35.

The other end of the resistor R35 is connected to the negative (−) terminal of an amplifier IC8 and one end of a resistor R36, the positive (+) terminal of the amplifier IC8 being connected to a terminal of a resistor R37 whereby a variable resistance value is obtained. The resistor R37 has one end connected to GND and has the other end connected to one end of a resistor R38, the other end of which is connected to −15 V. The resistor R36 has the other end connected to the output terminal of the amplifier IC8 and one end of a resistor R39.

The VCO IC9, to the input terminal of which is connected the other end of the resistor R39, is connected to GND and −5.2 V as driving voltages and has the output terminal connected to one end of a resistor R43 and the clock input terminals of FFs IC10 and IC11. The other end of the resistor R43 is connected to −5.2 V.

The D terminal of the FF IC10 is connected to the output terminal of a logic element IC12 and one end of a resistor R42, the other end of R42 is connected to −5.2 V. The QN terminal of the FF IC10 is connected to one input terminal of the logic element IC12, one end of a resistor R41 and the D terminal of the FF IC11. A resistor R40 has one end connected to −5.2 V, and has the other end connected to the other input terminal of the logic element IC12 and the Q terminal of the FF IC11.

The QN terminal of the FF IC11 is connected to one end of a coaxial cable K2, the other end of which is connected to the clock input terminal of the FF IC1 and one end of a resistor R11. The other end of the resistor R11 is connected to one end of a resistor R12 and one end of a capacitor C2. The resistor R12 has the other end connected to −5.2 V, while the capacitor C2 has the other end connected to GND.

Figure 28:
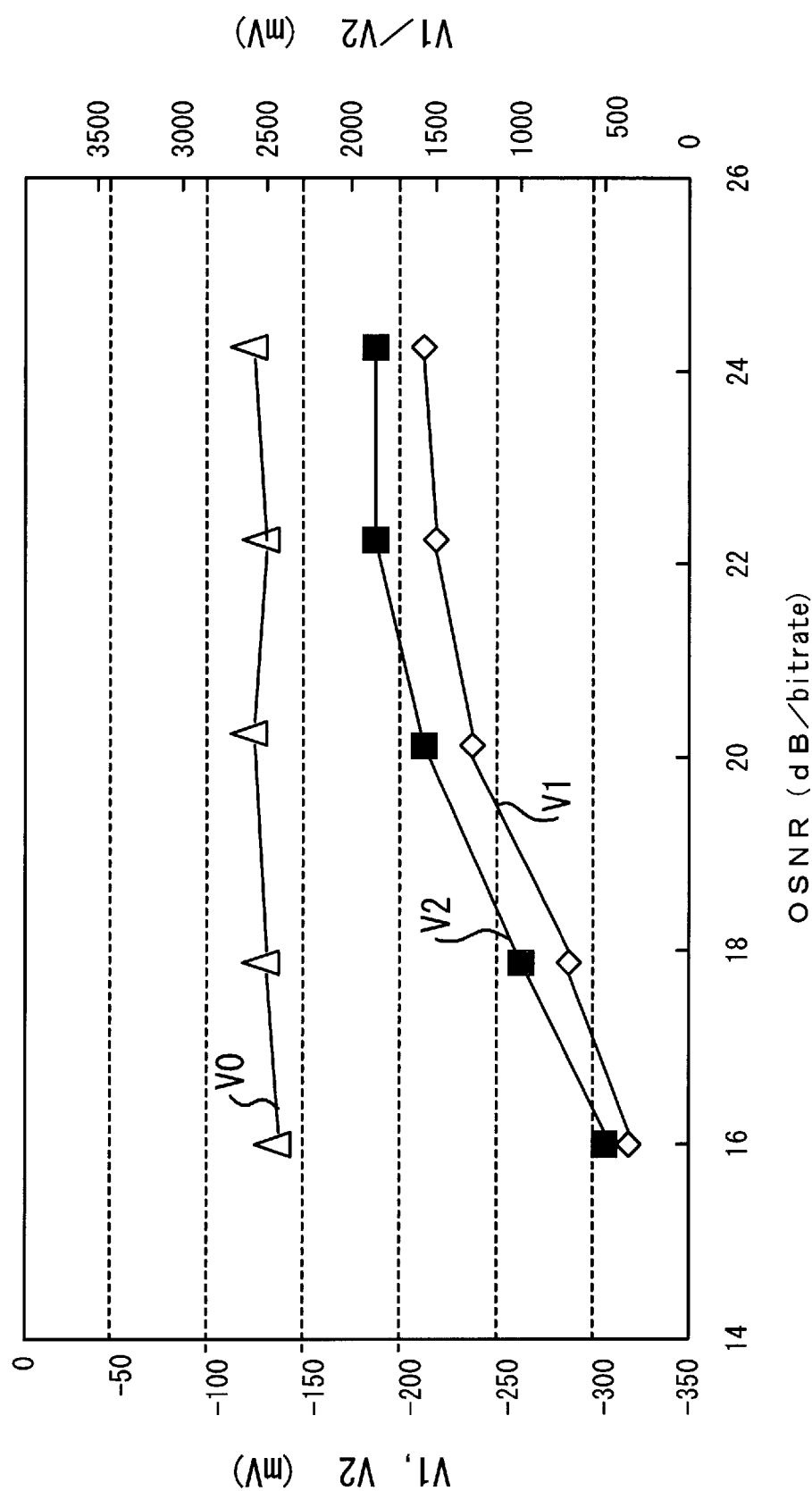
FIG. 28 is a diagram showing measured values of detection voltages and control voltage of the PLO device.
Figure 29:
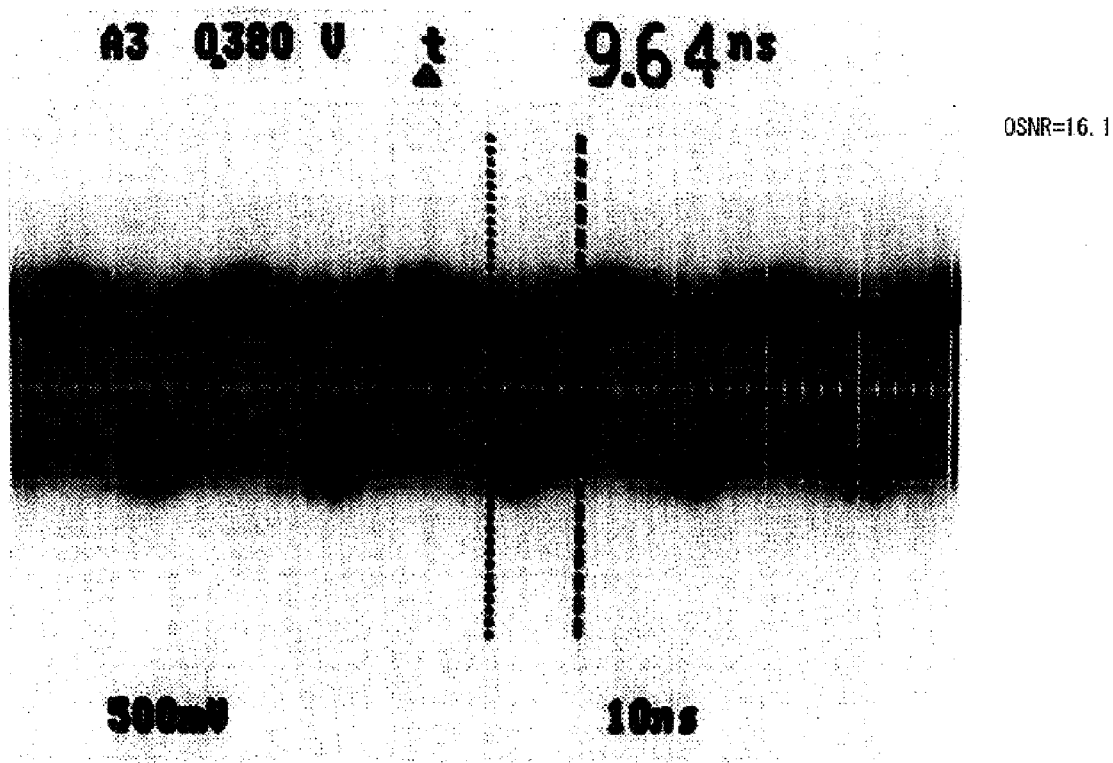
FIGS. 29 through 33 show observed waveforms of the PLO device.
Figure 30:
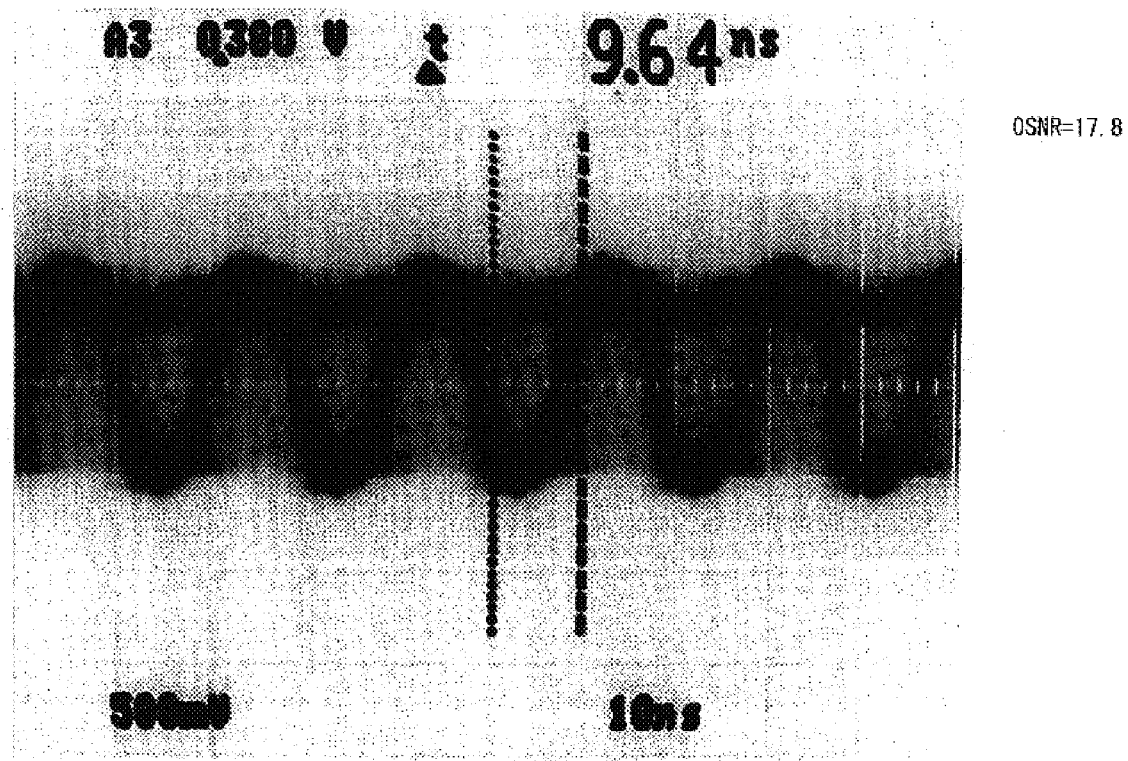
Figure 31:
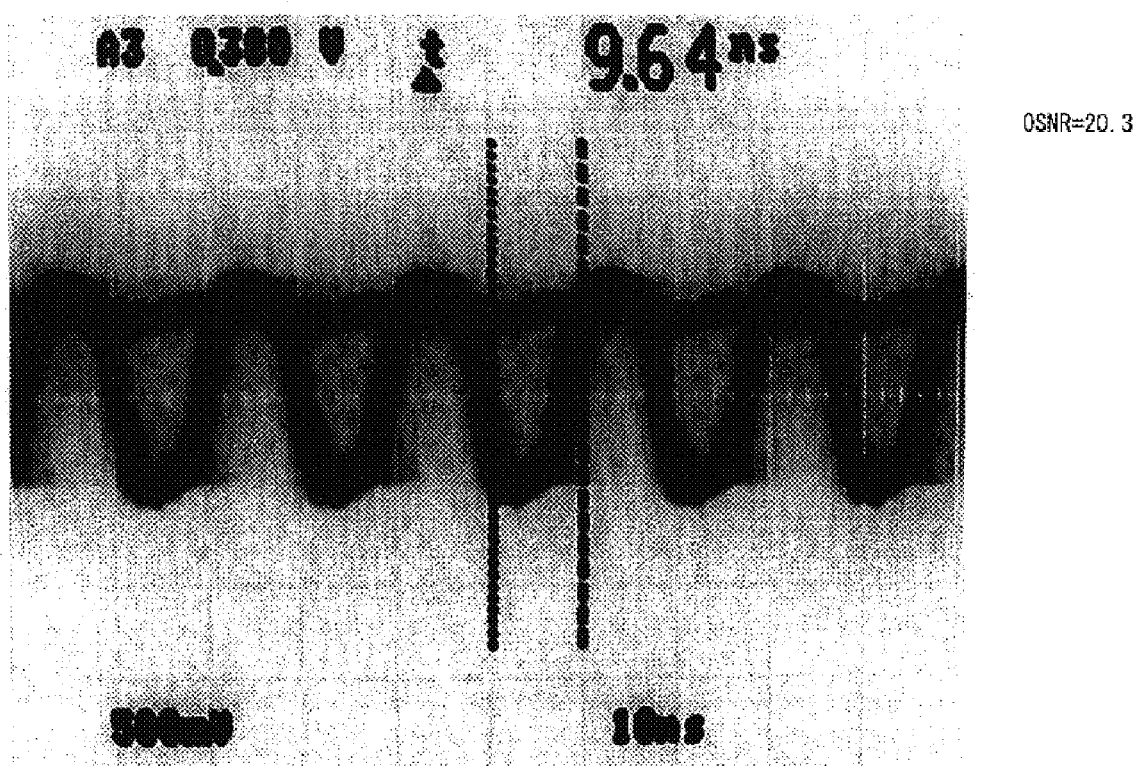
Figure 32:
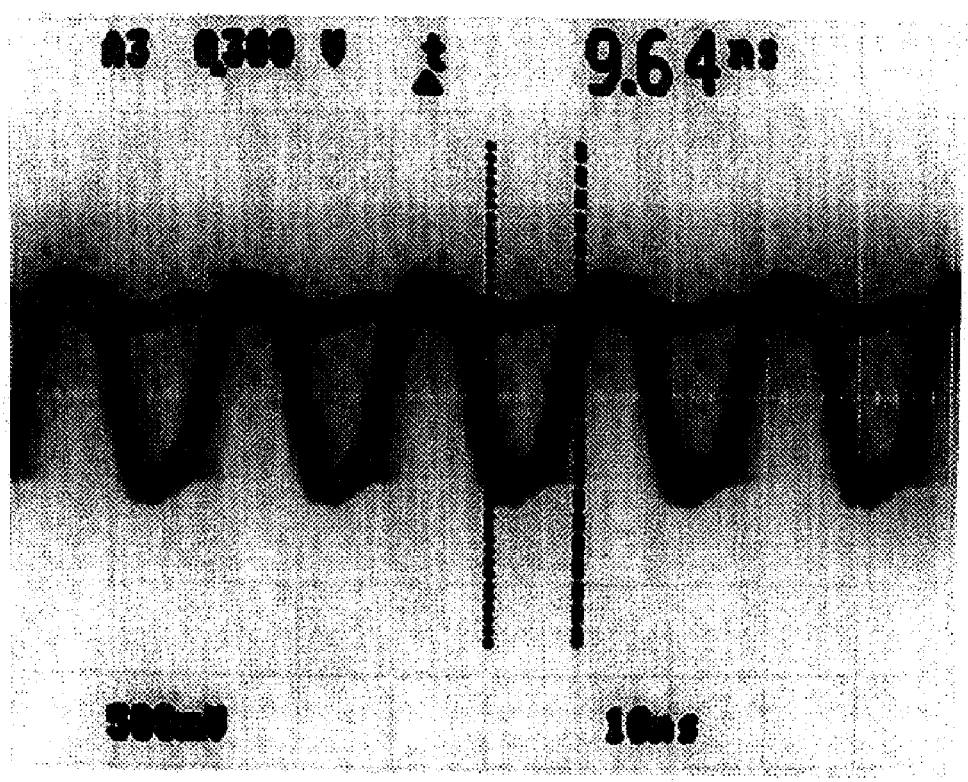
Figure 33:
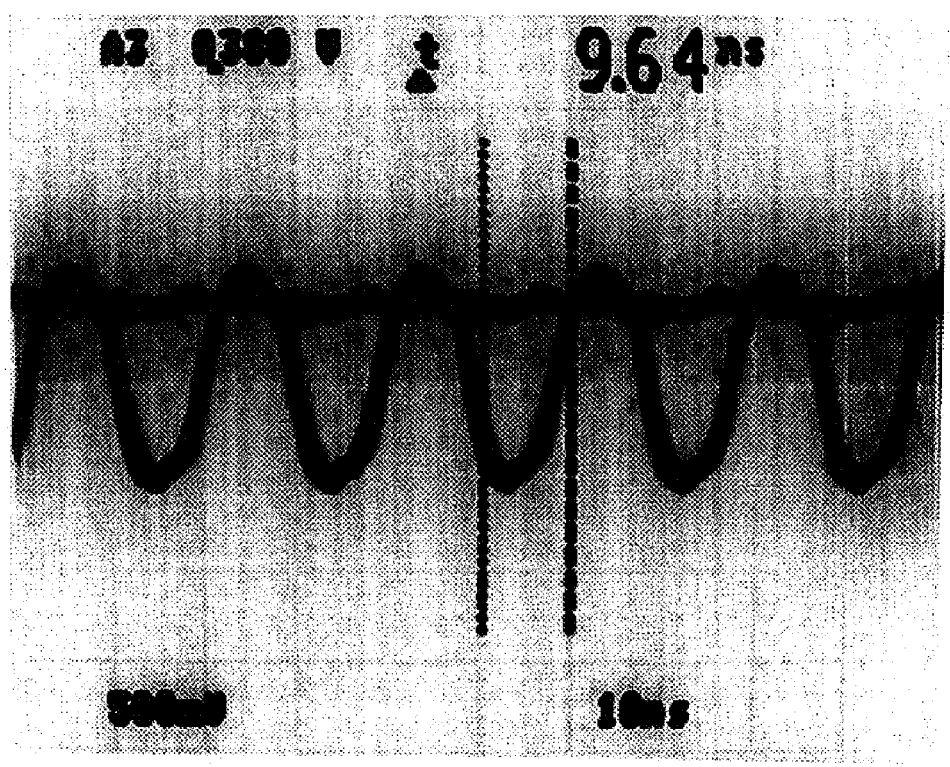

FIG. 28 shows measured values of the detection voltages and control voltage of the PLO device $1a$. The figure shows the values of the detection voltages V1 and V2 and control voltage V0 of the PLO device $1a$ measured by using the measurement system shown in FIG. 7. The left-hand vertical axis indicates the voltage value (mV) of the detection voltages V1 and V2, the right-hand vertical axis indicates the voltage value (mV) of the control voltage V0, and the horizontal axis indicates the OSNR (dB/bitrate). While π-phase input clock is introduced, waveforms of the PLO device $1a$ are observed with the OSNR changed to vary the S/N of the input signal.

As seen from the figure, in the OSNR range below 20 dB, the detection voltage V2 lowers along a curve similar to that of the detection voltage V1. Also, the difference data A5 (corresponding to the output signal of the logic element IC3 in the circuit shown in FIG. 25) has such an output waveform that the phase difference φ in equation (1) is fixed at π; accordingly, the detection voltage V2 can be indicated by equation (4) below.

(Detection voltage $V2$)=(Transition rate)·π·$f(S/N)$ (4)

Thus, the detection voltage V2 contains not only the transition rate-related parameter but the S/N-related parameter, whereby the parameters related to transition rate and S/N can be removed from the control voltage V0, which is the result of the division of the detection voltage V1 by the detection voltage V2. Even under low S/N conditions, therefore, it is possible to prevent malfunction such as clock phase change or out-of-phase error.

Observed waveforms of the PLO device $1a$ will be now explained. The waveform of the difference data A3 (corresponding to the output signal of the logic element IC2 in the circuit shown in FIG. 25) derived prior to the generation of the detection voltage V1 and the waveform of the difference data A5 (output signal of the logic element IC3) derived prior to the generation of the detection voltage V2 are observed using an oscilloscope.

Under satisfactory OSNR conditions, the difference data A3 shows an eye pattern with a large opening, but as the OSNR deteriorates, the opening of the observed waveform reduces. The difference data A5 is based on the data which has been delayed by an analog delay element (corresponding to the coaxial cable K1 in the circuit shown in FIG. 25), instead of a flip-flop. Consequently, like the difference data A3, under satisfactory OSNR conditions, the difference data A5 shows an eye pattern with a large opening, but as the OSNR deteriorates, the opening of the observed waveform reduces.

Figure 34:
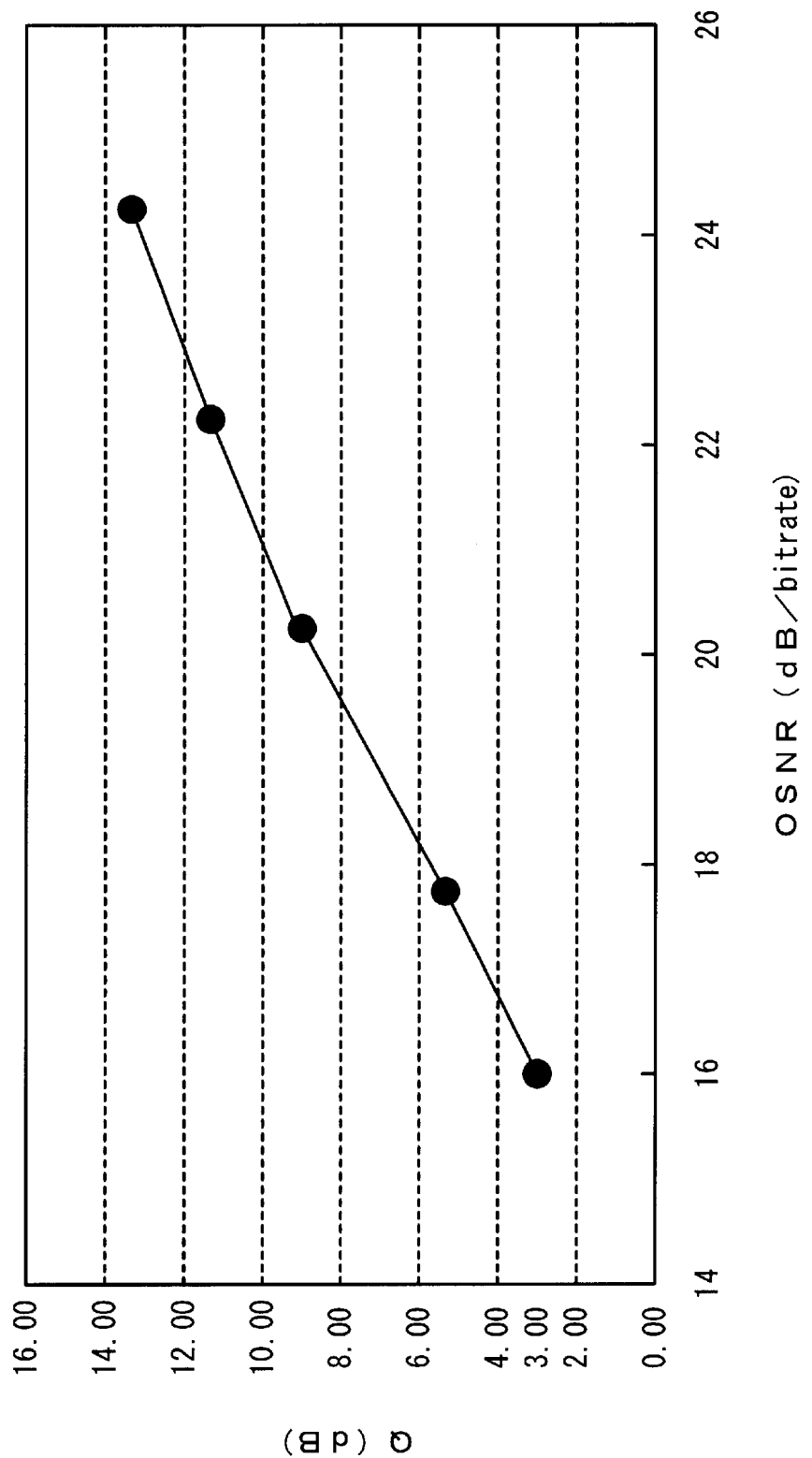
FIG. 34 is a diagram showing change in Q value with OSNR varied.

FIGS. 29 to 33 show observed waveforms of the PLO device $1a$, wherein the division of voltage is 500 mV and the division of time is 10 ns. The figures show waveform eye patterns of the difference data A5 (output signal of the logic element IC3). As seen from FIGS. 29 to 33, the eye pattern opening of the difference data A5 varies in accordance with the OSNR value (because the difference data A5 derived in the PLO device $1a$ of the present invention contains the S/N-related parameter, as distinct from the eye patterns of the difference data B4 shown in FIGS. 19 to 23).

Where the PLO device $1a$ was used, it was confirmed that the clock could be maintained in-phase with an error rate of up to $1 \times 10^{-1}$ while the loop was closed (in the state in which the recovered clock CK from the VCO section 40 is input to the FF 11 (FF IC1 in FIG. 25)). FIG. 34 shows the Q value with respect to different OSNRs, wherein the vertical axis indicates Q (dB) and the horizontal axis indicates OSNR (dB/bitrate). Namely, the figure shows the Q values obtained using the PLO device $1a$ with the OSNR changed to different values.

Figure 35:
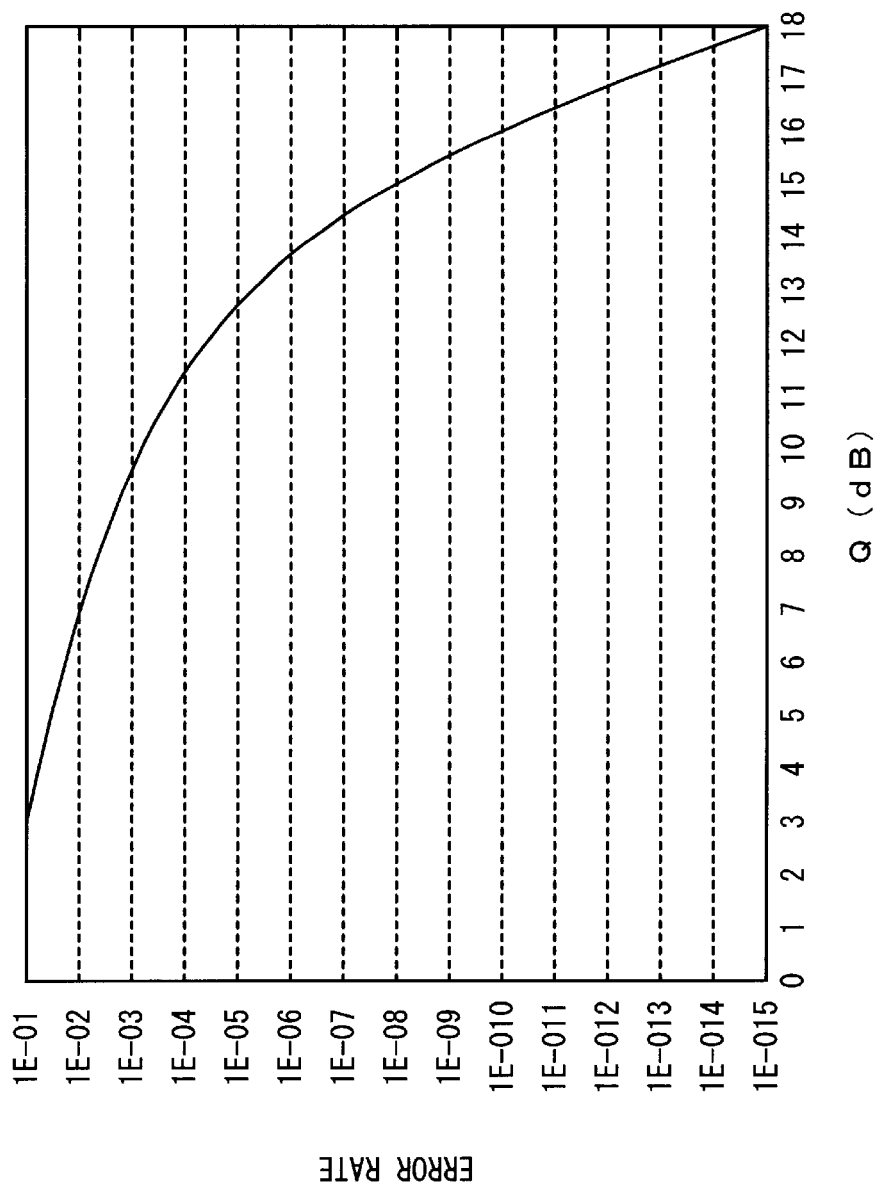
FIG. 35 is a diagram showing a table of conversion between the Q value and error rate.

FIG. 35 shows a table of conversion between the Q value and the error rate, wherein the vertical axis indicates the error rate and the horizontal axis indicates Q (dB). As seen from the measurement results shown in FIG. 34, when OSNR=16, Q=3, and from FIG. 35, the error rate=$1 \times 10^{-1}$.

The Q value and the error rate Pe are in the relationship indicated by equation (5) below (erfc is the complement to error function (erf)), and FIG. 35 is a graph in which Q is plotted exponentially based on equation (5).

$$Pe = \frac{1}{2} erfc\left(\frac{1}{\sqrt{2}} \times Q\right) \quad (5)$$

Figure 36:
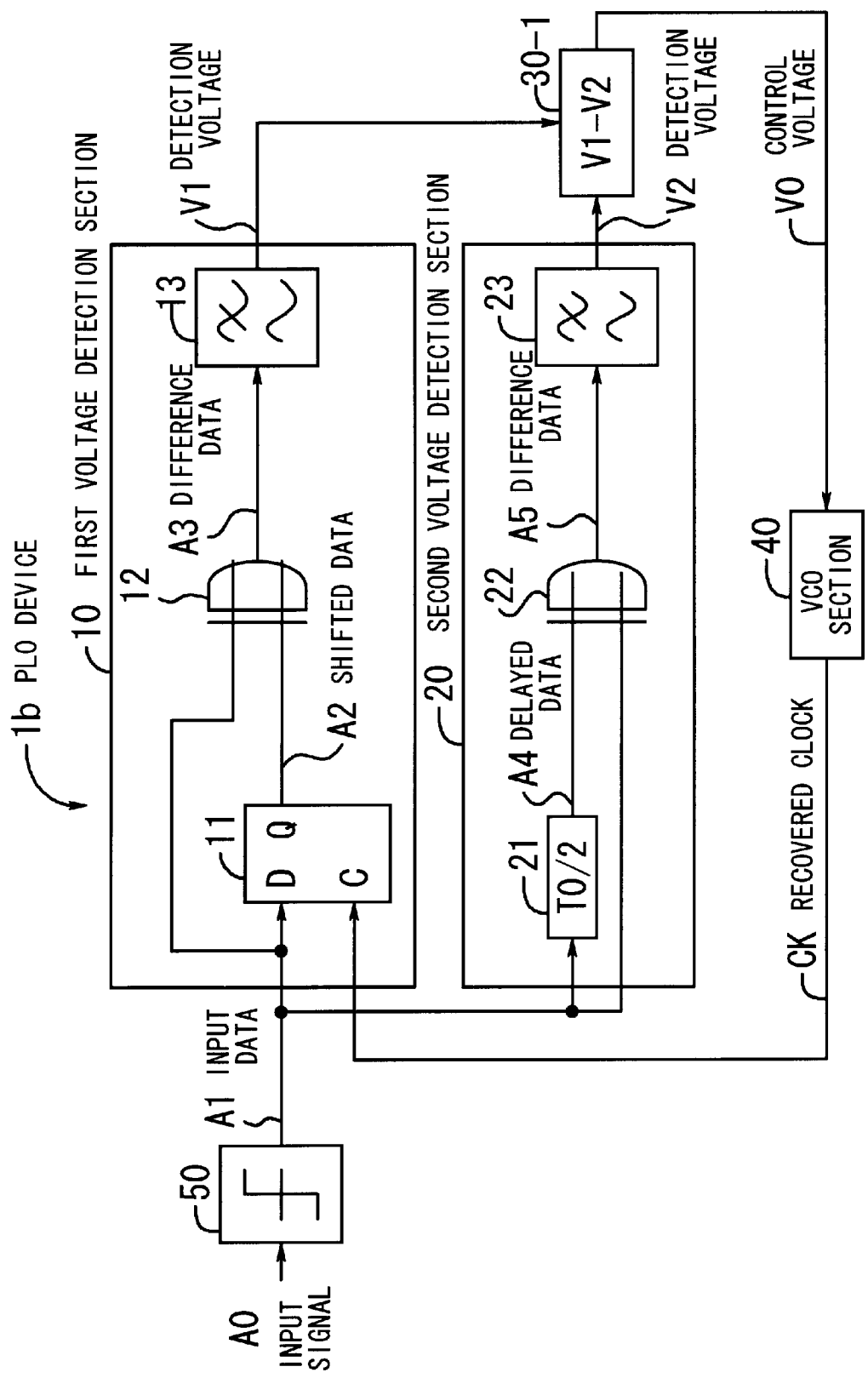
FIG. 36 is a diagram showing a modification of the PLO device.

A modification of the PLO device $1a$ will be now described. FIG. 36 illustrates a modification of the PLO device $1a$. In a PLO device $1b$ according to the modification, the detection voltage V2 is subtracted from the detection voltage V1 in an arithmetic section 30-1, to obtain the control voltage V0. In other respects, the PLO device $1b$ is configured in the same manner as the PLO device $1a$, and therefore, description thereof is omitted.

As described above, the PLO device 1 of the present invention is small in the scale of circuitry and yet can generate the control voltage V0 which is dependent neither on the transition rate-related parameter nor on the S/N-related parameter, so that the device can operate normally even under low S/N conditions. The PLO device can therefore be applied to transmission systems using high-performance FEC and enables high-quality communications.

Figure 37:
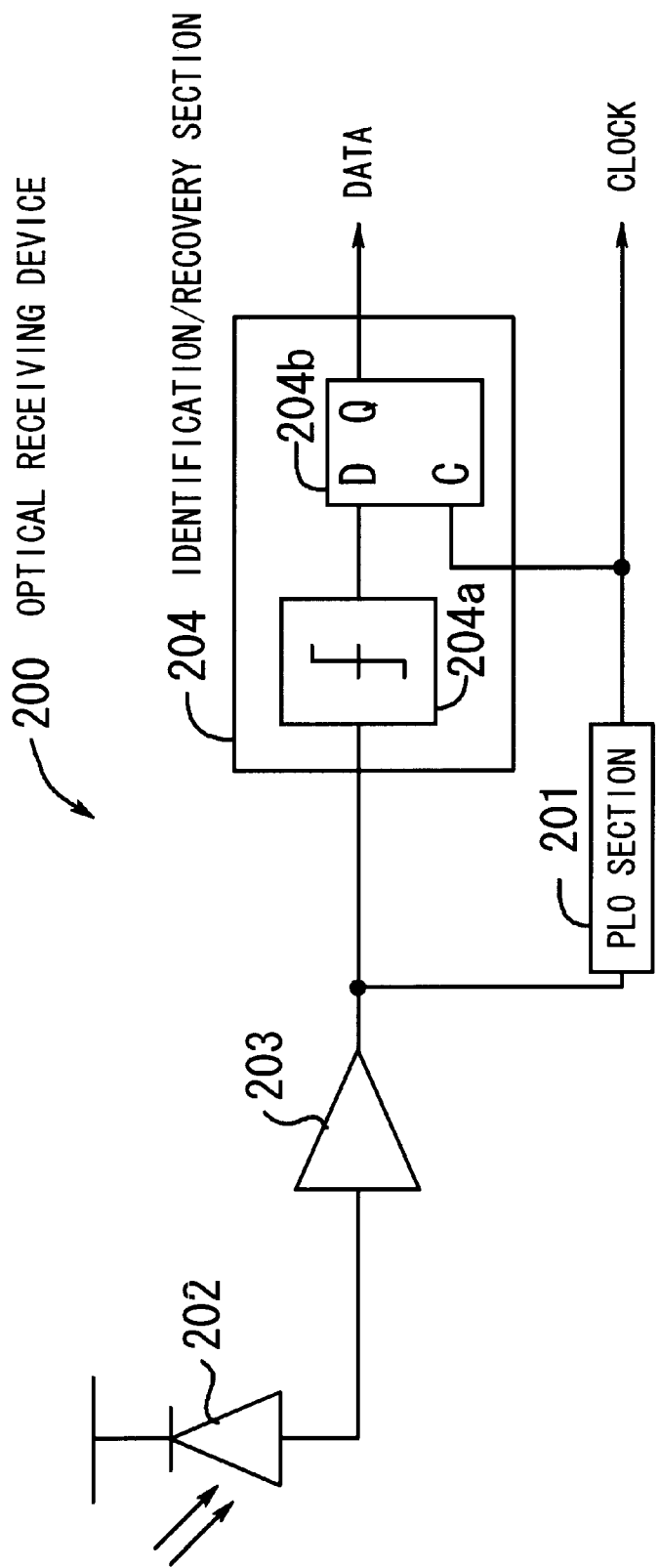
FIG. 37 is a diagram showing an optical receiving device.

Devices to which the PLO device 1 of the present invention is applied will be now described. FIG. 37 shows an optical receiving device. The optical receiving device 200, which receives an optical signal, comprises a PLO section 201 (corresponding to the PLO device $1a$), a photodiode 202, a buffer 203, and an identification/recovery section 204. The identification/recovery section 204 includes a discriminator 204$a$ and an FF 204$b$.

The photodiode 202 converts the optical signal to an electrical signal. The PLO section 201 recovers clock based on the electrical signal. The discriminator 204$a$ discriminates between "0" and "1" of the electrical signal supplied through the buffer 203, and the FF 204$b$ identifies an output signal from the discriminator 204$a$ by means of the recovered clock.

Figure 38:
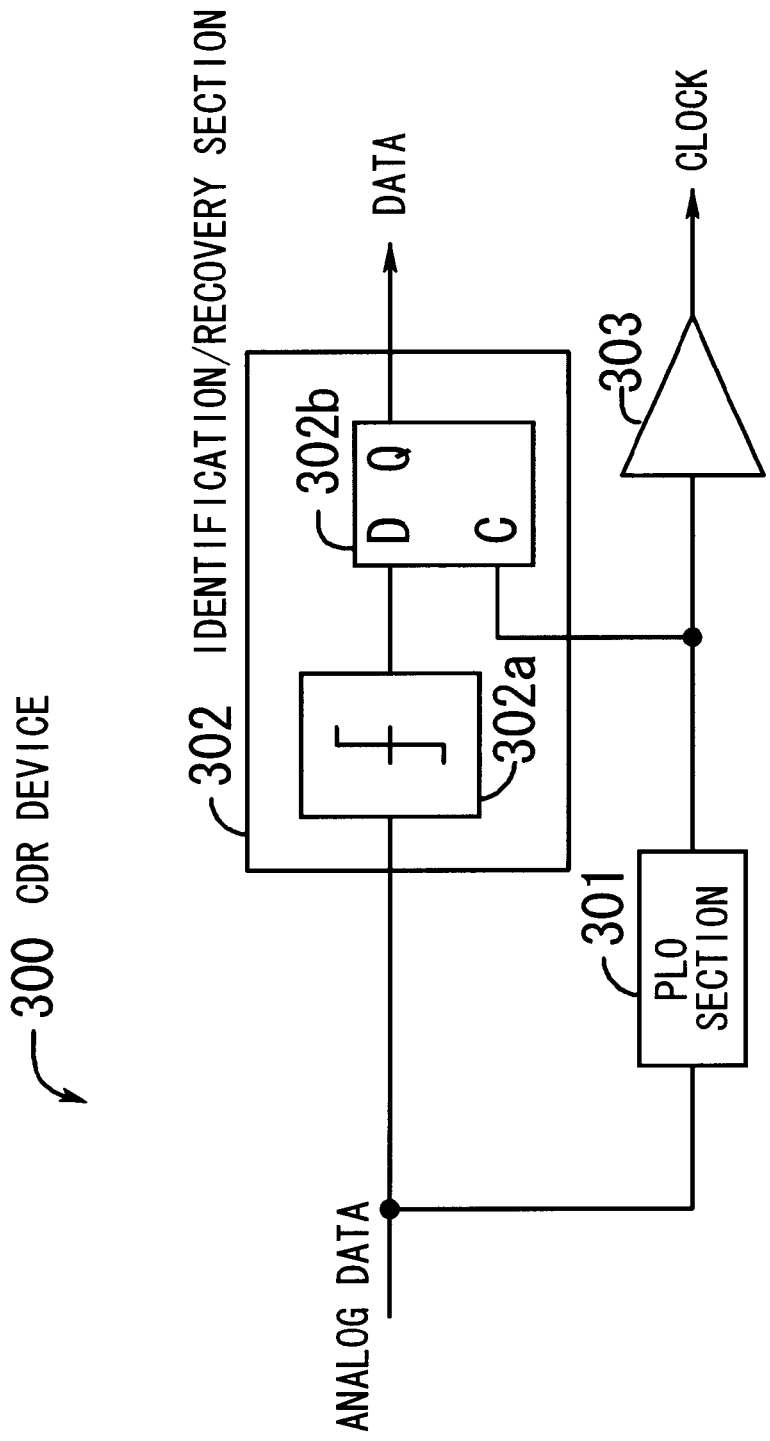
FIG. 38 is a diagram showing a clock data recovery device.

FIG. 38 shows a clock data recovery device. The clock data recovery device (CDR device) 300 for extracting clock, which is timing information, from input data to recover data comprises a PLO section 301 (corresponding to the PLO device $1a$), an identification/recovery section 302, and a buffer 303. The identification/recovery section 302 includes a discriminator 302$a$ and an FF 302$b$.

The PLO section 301 recovers clock from analog data. The recovered clock is sent to the FF 302b and is also output to outside through the buffer 303. The discriminator 302a discriminates between "0" and "1" of the analog data, and the FF 302b identifies an output signal from the discriminator 302a with the use of the recovered clock.

Figure 39:
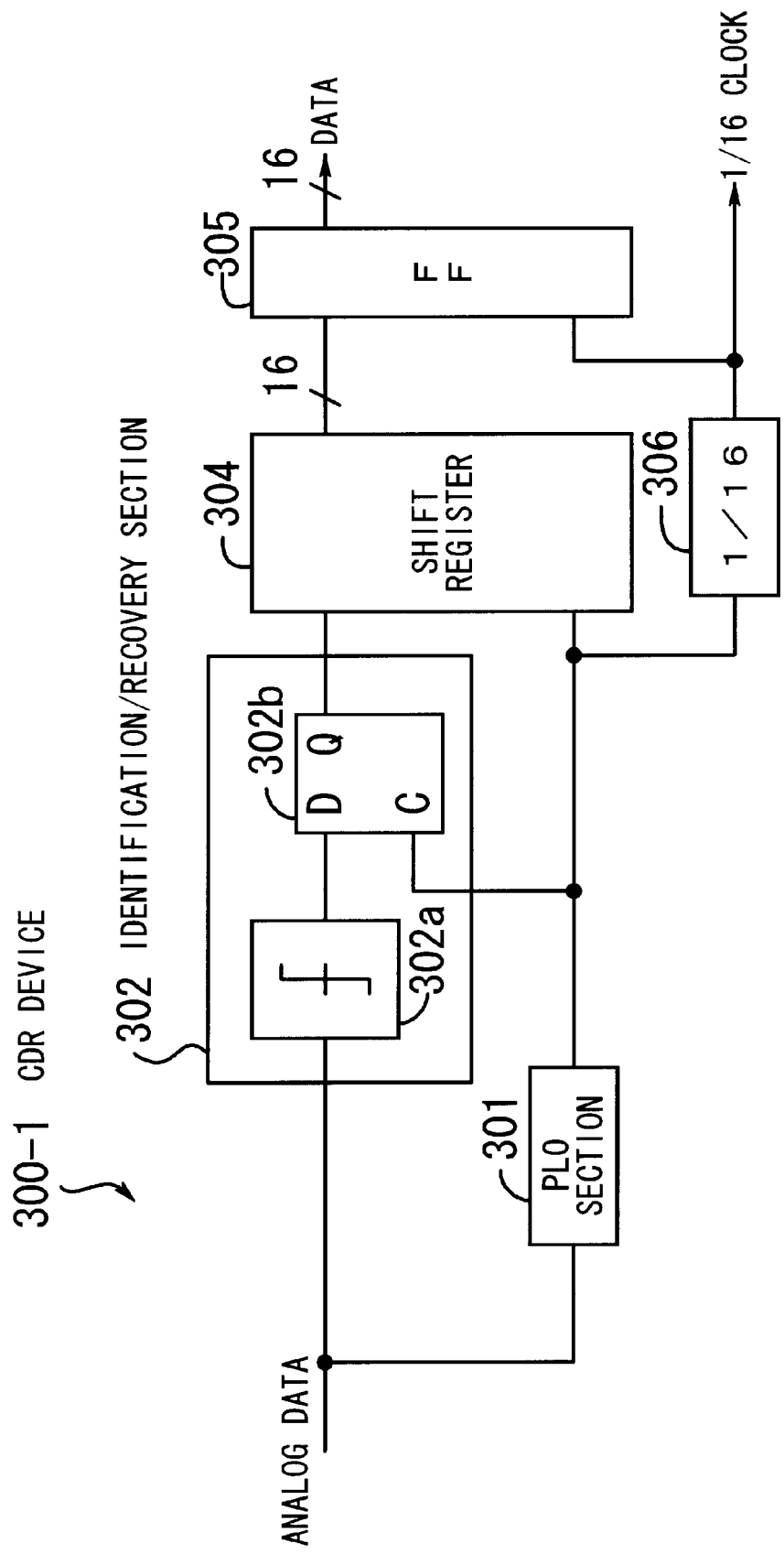
FIG. 39 is a diagram showing a CDR device having an S/P function added thereto.

FIG. 39 shows a CDR device having an S/P function added thereto. The CDR device 300-1 is similar to the CDR device 300 but additionally has the S/P function (16 parallel system). The CDR device 300-1 is constituted by the PLO section 301, the identification/recovery section 302, a shift register (16 stages) 304, an FF 305, and a frequency divider circuit (1/16) 306.

The PLO section 301 recovers clock from analog data. The recovered clock is sent to the FF 302b as well as to the shift register 304. The discriminator 302a discriminates between "0" and "1" of the analog data, and the FF 302b identifies an output signal from the discriminator 302a with the use of the recovered clock.

The shift register 304 receives the recovered clock and separates the output data from the discriminator 302a into 16 parallel data. The FF 305 identifies and outputs the 16 parallel data in accordance with the frequency-divided clock (1/16 of the recovered clock) from the frequency divider circuit (1/16) 306.

Figure 40:
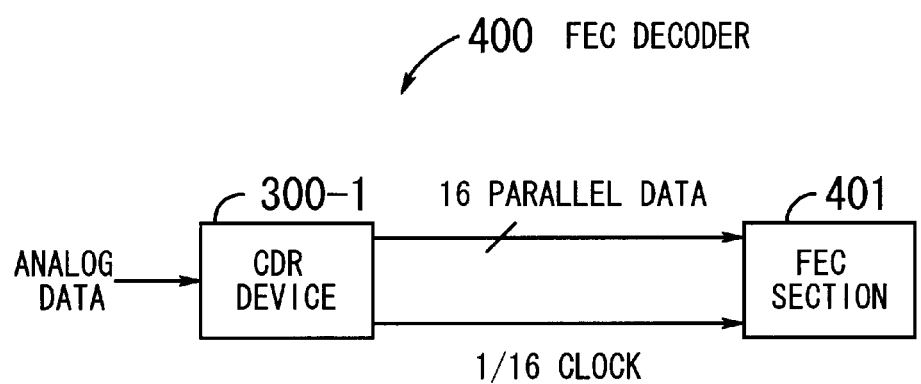
FIG. 40 is a diagram showing an FEC decoder.
Figure 41:
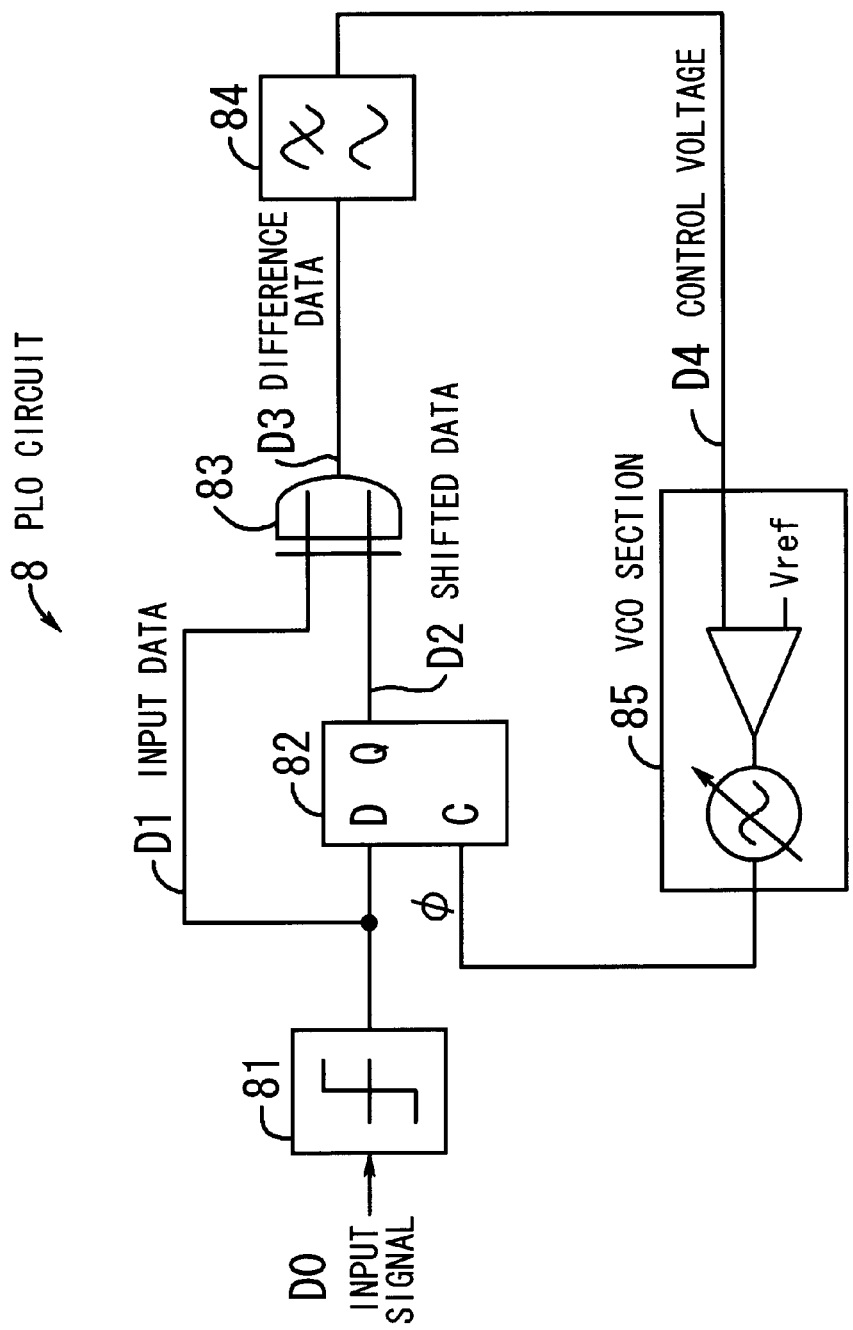
FIG. 41 is a diagram showing a configuration of a conventional PLO circuit.

FIG. 40 shows an FEC decoder. The FEC decoder 400, which performs an error correction process for input data, comprises the CDR device 300-1, explained above with reference to FIG. 39, and an FEC section 401. The FEC section 401 receives the 16 parallel data and 1/16 clock output from the CDR device 300-1 and corrects data errors.

The PLO device 1 according to the present invention is capable of operating normally even under low S/N conditions and, therefore, can be applied to devices used in various other fields than those mentioned above, such as transponders which perform band conversion, measurement equipment, observation equipment, etc.

As described above, in the PLO device according to the present invention, the first voltage detection section generates a first detection voltage relating to the first difference data which is derived based on input data and shifted data obtained by shifting the input data with the use of the recovered clock, and the second voltage detection section generates a second detection voltage relating to the second difference data which is derived based on the input data and delayed data obtained by delaying the input data for a time corresponding to half of one time slot. The first detection voltage is divided by the second detection voltage to obtain a control voltage, and in accordance with the control voltage, the recovered clock is output. This permits removal of parameters related to transition rate and SIN, making it possible to carry out high-accuracy, high-quality clock recovery.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A Phase Locked Oscillator (PLO) device for performing clock recovery based on an input signal, comprising:
a first voltage detection section including a shifted data generation part for shifting input data with use of recovered clock to generate shifted data, a first phase comparison part for comparing phases of the input data and the shifted data with each other and outputting first difference data, and a first filter for removing an alternating-current component from the first difference data and outputting a first detection voltage;
a second voltage detection section including a delay part for delaying the input data for a time corresponding to half of one time slot with use of an analog delay element and outputting delayed data, a second phase comparison part for comparing phases of the input data and the delayed data with each other and outputting second difference data, and a second filter for removing an alternating-current component from the second difference data and outputting a second detection voltage;
an arithmetic section for dividing the first detection voltage by the second detection voltage to obtain a control voltage; and
a clock oscillation section for outputting the recovered clock with an oscillation frequency thereof varied in accordance with the control voltage.

2. The PLO device according to claim 1, wherein the first detection voltage generated by the first voltage detection section contains parameters related to phase difference, transition rate and Signal Noise Ratio S/N the delay part included in the second voltage detection section allows the second detection voltage to contain the S/N-related parameter in addition to the transition rate-related parameter, and the arithmetic section removes the parameters related to transition rate and S/N by dividing the first detection voltage by the second detection voltage, to obtain the control voltage which is not dependent on the parameters related to transition rate and S/N.

3. An optical receiving device for receiving an optical signal, comprising:
a photoelectric conversion section for converting the optical signal to an electrical signal;
a Phase Locked Oscillator (PLO) section including a first voltage detection section having a shifted data generation part for shifting input data, which is the electrical signal, with use of recovered clock to generate shifted data, a first phase comparison part for comparing phases of the input data and the shifted data with each other and outputting first difference data, and a first filter for removing an alternating-current component from the first difference data and outputting a first detection voltage; a second voltage detection section having a delay part for delaying the input data for a time corresponding to half of one time slot with use of an analog delay element and outputting delayed data, a second phase comparison part for comparing phases of the input data and the delayed data with each other and outputting second difference data, and a second filter for removing an alternating-current component from the second difference data and outputting a second detection voltage; an arithmetic section for dividing the first detection voltage by the second detection voltage to obtain a control voltage; and a clock oscillation section for outputting the recovered clock with an oscillation frequency thereof varied in accordance with the control voltage; and
an identification/recovery section for identifying and recovering data information in the electrical signal in accordance with the recovered clock.

4. A clock data recovery device for extracting clock, which is timing information, from input data to recover data, comprising:
a Phase Locked Oscillator (PLO) including a first voltage detection section having a shifted data generation part for shifting the input data with use of recovered clock to generate shifted data, a first phase comparison part for comparing phases of the input data and the shifted data with each other and outputting first difference data, and a first filter for removing an alternating-current component from the first difference data and outputting a first detection voltage; a second voltage detection section having a delay part for delaying the input data for a time corresponding to half of one time slot with use of an analog delay element and outputting delayed data, a second phase comparison part for comparing phases of the input data and the delayed data with each other and outputting second difference data, and a second filter for removing an alternating-current component from the second difference data and outputting a second detection voltage; an arithmetic section for dividing the first detection voltage by the second detection voltage to obtain a control voltage; and a clock oscillation section for outputting the recovered clock with an oscillation frequency thereof varied in accordance with the control voltage; and an identification/recovery section for identifying and recovering the input data in accordance with the recovered clock.

5. A Formed Error Correction (FEC) for performing an error correction process for input data, comprising:

a clock data recovery section including a Phase Locked Oscillator (PLO) section and an identification/recovery section, the PLO section including a first voltage detection section having a shifted data generation part for shifting the input data with use of recovered clock to generate shifted data, a first phase comparison part for comparing phases of the input data and the shifted data with each other and outputting first difference data, and a first filter for removing an alternating-current component from the first difference data and outputting a first detection voltage; a second voltage detection section having a delay part for delaying the input data for a time corresponding to half of one time slot with use of an analog delay element and outputting delayed data, a second phase comparison part for comparing phases of the input data and the delayed data with each other and outputting second difference data, and a second filter for removing an alternating-current component from the second difference data and outputting a second detection voltage; an arithmetic section for dividing the first detection voltage by the second detection voltage to obtain a control voltage; and a clock oscillation section for outputting the recovered clock with an oscillation frequency thereof varied in accordance with the control voltage, the identification/recovery section identifying and recovering the input data in accordance with the recovered clock; and an FEC section for performing a process of correcting errors in the identified/recovered data.

6. A phase lock loop method for performing clock recovery based on an input signal, comprising:

shifting input data with use of recovered clock to generate shifted data;

comparing phases of the input data and the shifted data with each other and outputting first difference data;

removing an alternating-current component from the first difference data to obtain a first detection voltage containing parameters related to phase difference, transition rate and Signal Noise Ratio (S/N);

delaying the input data for a time corresponding to half of one time slot with use of an analog delay element to obtain delayed data;

comparing phases of the input data and the delayed data with each other and outputting second difference data;

removing an alternating-current component from the second difference data to obtain a second detection voltage containing the parameters related to transition rate and S/N;

dividing the first detection voltage by the second detection voltage to obtain a control voltage free of the parameters related to transition rate and S/N; and generating the recovered clock with an oscillation frequency varied in accordance with the control voltage which is independent of the parameters related to transition rate and S/N.

\* \* \* \* \*